United States Patent
Kanno et al.

[11] Patent Number: 6,069,971
[45] Date of Patent: *May 30, 2000

[54] PATTERN COMPARISON INSPECTION SYSTEM AND METHOD EMPLOYING GRAY LEVEL BIT MAP

[75] Inventors: Makoto Kanno; Koichi Moriizumi, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/866,244

[22] Filed: Jun. 2, 1997

[30] Foreign Application Priority Data

Dec. 18, 1996 [JP] Japan ..................... 8-338450

[51] Int. Cl.⁷ ............................................. G06K 9/00
[52] U.S. Cl. ......................... 382/144; 348/129; 382/218
[58] Field of Search .................................. 382/144, 220, 382/149, 217, 209, 218, 219; 348/130, 125, 126, 129; 430/5, 30

[56] References Cited

U.S. PATENT DOCUMENTS

| | | | |
|---|---|---|---|
| 4,669,123 | 5/1987 | Kobayashi et al. | 382/144 |
| 4,685,145 | 8/1987 | Schiller | 382/52 |
| 4,958,374 | 9/1990 | Tokita et al. | 382/149 |
| 5,048,094 | 9/1991 | Aoyama et al. | 382/8 |
| 5,095,511 | 3/1992 | Okazaki | 382/144 |
| 5,396,584 | 3/1995 | Lee et al. | 395/132 |

FOREIGN PATENT DOCUMENTS

| | | |
|---|---|---|
| 5-272941 | 10/1993 | Japan . |
| 7-260699 | 10/1995 | Japan . |
| 86-5305 | 7/1986 | Rep. of Korea . |

OTHER PUBLICATIONS

Kenneth Levy, "Automated Equipment for 100% Inspection of Photomasks", Solid State Technology, May 1978, pp. 60–66 and 71.

"VLSL mask Data Comparison Inspection System", M. Kanno et al., Mitsubishi Denki Giho vol. 68, No. 3, 1994 pp. 86–89 and 114.

*Primary Examiner*—Bhavesh Mehta
*Attorney, Agent, or Firm*—McDermott, Will & Emery

[57] ABSTRACT

A pattern comparison inspection system includes: an occupancy calculating portion for dividing pattern data into pixel regions and calculating a ratio of divided pattern data to a pixel region; a gray level bit map generating portion for generating a gray level bit map based on the ratio of the divided pattern data; and a bit map comparing portion for making a comparison between a gray level bit map for design pattern data and a gray level bit map for pattern data for an electron beam patterning system both generated by the occupancy calculating portion and the gray level bit map generating portion to determine whether the pattern data for an electron beam patterning system matches the design pattern data.

17 Claims, 27 Drawing Sheets

$$\begin{pmatrix} 0.00, 0.00, 0.00, 0.00, 0.00, 0.00, \\ 0.00, 0.00, 0.00, 0.00, 0.00, 0.00, \\ 0.00, 1.00, 0.00, 0.00, 0.00, 0.00, \\ 0.00, 1.50, 1.00, 1.00, 0.00, 0.00, \\ 0.00, 0.00, 0.00, 0.00, 0.00, 0.00 \end{pmatrix}$$

$$\begin{pmatrix} 0.40, 0.35, 0.00, \\ 0.00, 0.40, 0.00, \\ 0.00, 0.40, 0.00, \end{pmatrix} \text{—61}$$

$$\begin{pmatrix} 0.00, 0.00, 0.00, \\ 0.30, 0.40, 0.00, \\ 0.00, 0.30, 0.00, \end{pmatrix} \text{—64}$$

PATTERN COMPARISON INSPECTION SYSTEM AND METHOD EMPLOYING GRAY LEVEL BIT MAP

BACKGROUND OF THE INVENTION

1. Field of the Invention

The present invention relates to a system and a method for inspecting pattern data for an electron beam patterning system producing masks used in manufacturing semiconductor integrated circuits, and more particularly to a system and a method of comparing and inspecting patterns for comparison between design pattern data and pattern data for an electron beam patterning system generated from the design pattern data and inspection thereof.

2. Description of the Background Art

In recent years, with highly integrated, multi-function semiconductor integrated circuits, the circuit scale tends to be increased and thus there is a demand for a mask of higher quality used in the process for manufacturing semiconductor integrated circuits.

Electron beam patterning systems are commonly used for fabricating masks used in manufacturing semiconductor integrated circuits and, in particular, large scale integrated circuits (LSI), due to their good micro-lithography performance and controllability.

Pattern data for an electron beam patterning system used in the mask fabrication is generated from design pattern data. Whether or not the pattern data for the (raster scan system) electron beam patterning system matches the design pattern data is visually determined by the designer, by displaying both of the pattern data on a graphic display. With finer and larger scale pattern data, however, it is difficult to determine whether the data match by visual inspection by the designer and thus a pattern comparison device is being developed capable of automatically determine whether pattern data for an electron beam patterning system matches design pattern data.

FIG. 1 is a block diagram showing a configuration of a conventional pattern comparison device. The pattern comparison device includes a design pattern data file 101 for storing design pattern data, an electron beam patterning system pattern data file 102 for storing pattern data for an electron beam patterning system, a binary bit map generating portion 103 for generating a binary bit map from the pattern data, a reference binary bit map file 104 for storing a binary bit map generated from the design pattern data (i.e., a reference binary bit map), an inspected binary bit map file 105 for storing a binary bit map generated from the pattern data for an electron beam patterning system (i.e., an inspected binary bit map), a bit map comparing portion 106 for comparing map, and a comparison result file 107 for storing comparison results.

The design pattern data is design data for a pattern formed in a mask and is represented by a coordinate value of the profile of the pattern involved. The pattern data for an electron beam patterning system is pattern data used when a mask is exposed by an electron beam patterning system, and is provided so that a pattern is drawn by a combination of figures, such as triangles and rectangles, readily drawn with electron beam. Pattern data for an electron beam patterning system is generated from design pattern data, and precision of a pattern obtained from design pattern data is typically higher than precision of a pattern drawn by an electron beam patterning system. Thus, when pattern data for an electron beam patterning system is generated from design pattern data, an error to some extent is produced.

Binary bit map generating portion 103 divides a pattern obtained from design pattern data or pattern data for an electron beam patterning system into smaller rectangles which are binarized depending on whether the center of each rectangle is white or black. Then, each small rectangle is used as one pixel to make the respective patterns into bit maps. The produced binary bit maps are stored into reference binary bit map file 104 and inspected binary bit map file 105, respectively.

Bit map comparing portion 106 compares the inspected binary bit map with the reference binary bit map to detect and store any non-match portion into comparison result file 107. The designer displays the non-match portion on a graphic display to determine whether the pattern data for an electron beam patterning system matches the design pattern data.

FIG. 2 shows a reference binary bit map generated from design pattern data, an inspected binary bit map generated from pattern data for an electron beam patterning system, and a result of comparison between the two bit maps. Design pattern data 108 is binarized and made into a bit map in binary bit map generating portion 103 to generate a reference binary bit map 110. An inspected binary bit map 111 is similarly generated from pattern data 109 for an electron beam patterning system. Bit map comparing portion 106 compares inspected binary bit map 111 with reference to binary bit map 110 to generate a comparison result 112, wherein 0 represents a match portion and 1 represents a non-match portion. Thus, it can be seen that when the position of design pattern data 108 is only slightly different from the position of pattern data 109 for an electron beam patterning system, a non-match portion is generated within comparison result 112.

FIG. 3 shows a reference binary bit map generated from design pattern data, an inspected binary bit map when a sizing processing is applied to pattern data for an electron beam patterning system, and a result of comparison between the bit maps. For pattern data in which more portions are irradiated with electron beam, pattern data in which less portions are irradiated with electron beam, or pattern data in which adjacent pattern data are closely arranged, it is necessary to enlarge or reduce the design pattern data in generating pattern data for an electron beam patterning system from the design pattern data, in order to prevent degradation of the quality of a pattern formed in a mask. The enlarging or reducing processing is referred to as a sizing processing.

Design pattern data 108 is binarized and made into a bit map at binary bit map generating portion 103 to generate a reference binary bit map 110. Meanwhile, a sizing processing is applied to pattern data 109 for an electron beam patterning system generated from design pattern data 108 to generate enlarged pattern data 113 from which an inspected binary bit map 114 is then generated. Bit map comparing portion 106 compares inspected binary bit map 114 with reference binary bit map 110 to generate a comparison result 115. A sizing process is thus applied to pattern data 109 for an electron beam patterning system to find any non-match portion generated within comparison result 115.

Furthermore, a vector scan system electron beam patterning system is used in mask fabrication in the frontiers of technology. A position to be irradiated with electron beam for a vector scan system electron beam patterning system can be the inverse of a position to be irradiated with electron beam for a raster scan system electron beam patterning system and thus black-white inversion need be applied to the design pattern data.

FIG. 4 shows a reference binary bit map generated from design pattern data, an inspected binary bit map when black-white inversion is applied to pattern data for an electron beam patterning system, and a result of comparison between the bit maps. Design pattern data 108 is binarized and made into a bit map at binary bit map generating portion 103 to generate a reference binary bit map 110. Meanwhile, black-white inversion is applied to pattern data 109 for an electron beam patterning system generated from design pattern data 108, to generate pattern data 116 from which an inspected binary bit map 117 is then generated. Bit map comparing portion 106 compares inspected binary bit map 117 with reference binary bit map 110 to generate a comparison result 118. Thus, black-white inversion is applied to pattern data for an electron beam patterning system to find any non-match portion generated within comparison result 118.

As described with reference to FIG. 2, with a conventional pattern comparison device, even a slight difference caused in generating pattern data for an electron beam patterning system from design pattern data which does not substantially affect the quality of a mask is identified as a non-match portion and thus confirmation operation by the designer is disadvantageously increased.

Furthermore, with a conventional pattern comparison inspection system, as described with reference to FIG. 3, a sizing processing need be applied to design pattern data for the improvement in finished precision of a mask. Thus, when pattern data for an electron beam patterning system after a sizing processing is compared with the design pattern data, most of the portions are disadvantageously identified as non-match portions.

Furthermore, as described with reference to FIG. 4, when a vector scan system electron beam patterning system is used for mask fabrication, all of the portions of a comparison result can be identified as non-match portions and thus conventional pattern comparison devices cannot be applied.

SUMMARY OF THE INVENTION

An object of the present invention is to provide a pattern comparison inspection system capable of automatically identifying a difference between design pattern data and pattern data for an electron beam patterning system as a difference not substantially affecting mask quality or a difference disadvantageously affecting mask quality.

Another object of the present invention is to provide a pattern comparison inspection system capable of detecting a multi-exposed portion.

Another object of the present invention is to provide a method of comparing and inspecting patterns, capable of automatically identifying a difference between design pattern data and pattern data for electron beam patterning system as a difference not substantially affecting mask quality or a difference disadvantageously affecting mask quality.

Another object of the present invention is to provide a method of comparing and inspecting patterns, capable of detecting a multi-exposed portion.

Another object of the present invention is to provide a medium having a pattern comparison inspection program recorded thereon, capable of automatically identifying a difference between design pattern data and pattern data for an electron beam patterning system as a difference not substantially affecting mask quality or a difference disadvantageously affecting mask quality.

Another object of the present invention is to provide a medium having a pattern comparison inspection program recorded thereon, capable of detecting a multi-exposed portion.

In an aspect of the present invention, a pattern comparison inspection system includes an occupancy calculating portion for dividing pattern data into pixel regions and calculating a ratio of a divided pattern data to a pixel region, a gray level bit map generating portion for generating a gray level bit map based on a ratio of divided pattern data, and a bit map comparing portion for performing a comparison between a gray level bit map for design pattern data and a gray level bit map for pattern data for an electron beam patterning system both generated by the occupancy calculating portion and the gray level bit map generating portion to determine whether the pattern data for an electron beam patterning system matches the design pattern data.

Since the bit map comparing portion makes a comparison between a gray level bit map generated from design pattern data and a gray level bit map generated from pattern data for an electron beam patterning system, any slight difference between the design pattern data and the pattern data for an electron beam patterning system can be detected. Thus, the pattern comparison inspection system can automatically identify a difference between design pattern data and pattern data for an electron beam patterning system as a difference not substantially affecting mask quality or a difference disadvantageously affecting mask quality.

In another aspect of the present invention, a pattern comparison inspection system includes an occupancy calculating portion for dividing pattern data into pixel regions and calculating a ratio of divided pattern data to a pixel region, a gray level bit map generating portion for generating a gray level bit map based on a ratio of divided pattern data, and a multi-exposure detect portion for detecting as a multi-exposure a pixel region having a ratio of divided pattern data exceeding a predetermined value in a gray level bit map for pattern data for an electron beam patterning system generated by the occupancy calculating portion and the gray level bit map generating portion.

The multi-exposure detect portion detects as a multi-exposure a pixel region having a ratio of divided pattern data exceeding a predetermined value in a gray level bit map for pattern data for an electron beam patterning system. Since the multi-exposure results in the degradation in quality of a pattern in a mask, the detection of a multi-exposed portion allows confirmation of degradation in quality of a pattern in a mask beforehand.

In another aspect of the present invention, a method of comparing and inspecting patterns includes the steps of: dividing design pattern data into pixel regions and calculating a ratio of divided design pattern data to a pixel region; generating a gray level bit map based on a ratio of divided design pattern data; dividing pattern data for an electron beam patterning system into pixel regions and calculating a ratio of divided pattern data for an electron beam patterning system to a pixel region; generating a gray level bit map based on a ratio of divided pattern data for an electron beam patterning system; and comparing a gray level bit map for pattern data for an electron beam patterning system with a gray level bit map for design pattern data to determine whether the pattern data for an electron beam patterning system matches the design pattern data.

Since a comparison is made between a gray level bit map generated from design pattern data and a gray level bit map generated from pattern data for an electron beam patterning system, any slight difference between the design pattern data and the pattern data for an electron beam patterning system can be detected. Thus, the pattern comparison inspection system can automatically identify a difference between design pattern data and pattern data for an electron beam patterning system as a difference not substantially affecting mask quality or a difference disadvantageously affecting mask quality.

In another aspect of the present invention, a method of comparing and inspecting patterns includes the steps of: dividing pattern data for an electron beam patterning system into pixel regions and calculating a ratio of divided pattern data for an electron beam patterning system to a pixel region; generating a gray level bit map based on a ratio of divided pattern data for an electron beam patterning system; and detecting as a multi-exposure a pixel region having a ratio of divided pattern data exceeding a predetermined value in a gray level bit map for pattern data for an electron beam patterning system.

A pixel region in which a ratio of divided pattern data to the pixel region exceeds a predetermined value within a gray level bit map for pattern data for an electron beam patterning system is detected as a multi-exposure which leads to the degradation in quality of a pattern in a mask. Thus, the detection of a multi-exposed portion allows detection of the degradation in quality of a pattern in a mask in advance.

In another aspect of the present invention, a medium having a pattern comparison inspection program recorded thereon includes the steps of: dividing design pattern data into pixel regions and calculating a ratio of divided design pattern data to a pixel region; generating a gray level bit map based on a ratio of divided design pattern data to a pixel region; dividing pattern data for an electron beam patterning system into pixel regions and calculating a ratio of divided pattern data for an electron beam patterning system to a pixel region; generating a gray level bit map based on a ratio of divided pattern data for an electron beam patterning system to a pixel region; and comparing a gray level bit map for pattern data for an electron beam patterning system with a gray level bit map for design pattern data to determine whether the pattern data for an electron beam patterning system matches the design pattern data.

Since the bit map comparing portion makes a comparison between a gray level bit map generated from design pattern data and a gray level bit map generated from pattern data for an electron beam patterning system, any slight difference between the design pattern data and the pattern data for an electron beam patterning system can be detected. Thus, the pattern comparison inspection system can automatically identify a difference between design pattern data and pattern data for an electron beam patterning system as a difference not substantially affecting mask quality or a difference disadvantageously affecting mask quality.

In another aspect of the present invention, a medium having a pattern comparison inspection program recorded thereon includes the steps of: dividing pattern data for an electron beam patterning system into pixel regions and calculating a ratio of divided pattern data for an electron beam patterning system to a pixel region; generating a gray level bit map based on a ratio of divided pattern data for an electron beam patterning system to a pixel region; and detecting as a multi-exposure a pixel region in which a ratio of divided pattern data for an electron beam patterning system to a pixel region exceeds a predetermined value within a gray level bit map for pattern data for an electron beam patterning system.

A pixel region in which a ratio of divided pattern data for an electron beam patterning system to a pixel region exceeds a predetermined value within a gray level bit map for pattern data for an electron beam patterning system is detected as a multi-exposure which leads to the degradation in quality of a pattern in a mask. Thus, the detection of a multi-exposed portion allows confirmation of the degradation in quality of a pattern in a mask in advance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
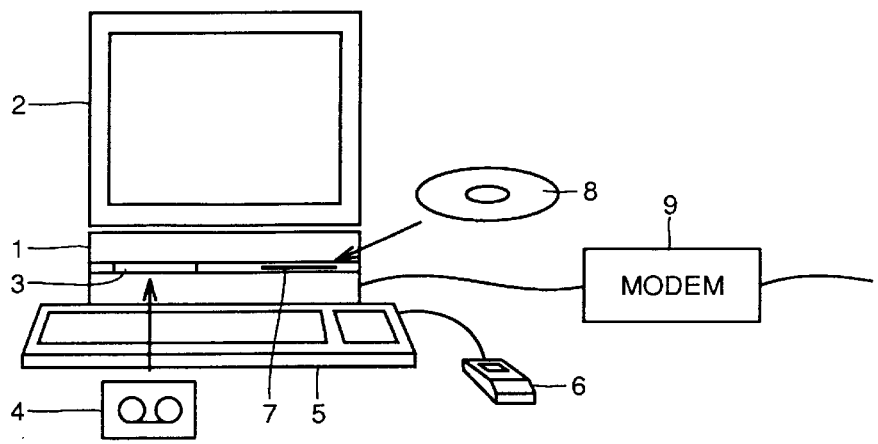
FIG. 5 shows an appearance of a pattern comparison inspection system according to the present invention.

Referring to FIG. 5, a pattern comparison inspection system includes a computer body 1, a graphic display device 2, a magnetic tape device 3, a magnetic tape 4, a keyboard 5, a mouse 6, a CD-ROM (Compact Disk-Read Only Memory) device 7, a CD-ROM 8, and a communication modem 9. As described later, a pattern comparison inspection program is supplied by a recording medium such as magnetic tape 4 and CD-ROM 8. The pattern comparison inspection program is carried out by computer body 1, and the operator operates keyboard 5 or mouse 6 while viewing graphic display device 2 to compare and inspect patterns. The pattern comparison inspection program may be supplied to the computer body via communication modem 9 and on a communication line from another computer.

Figure 6:
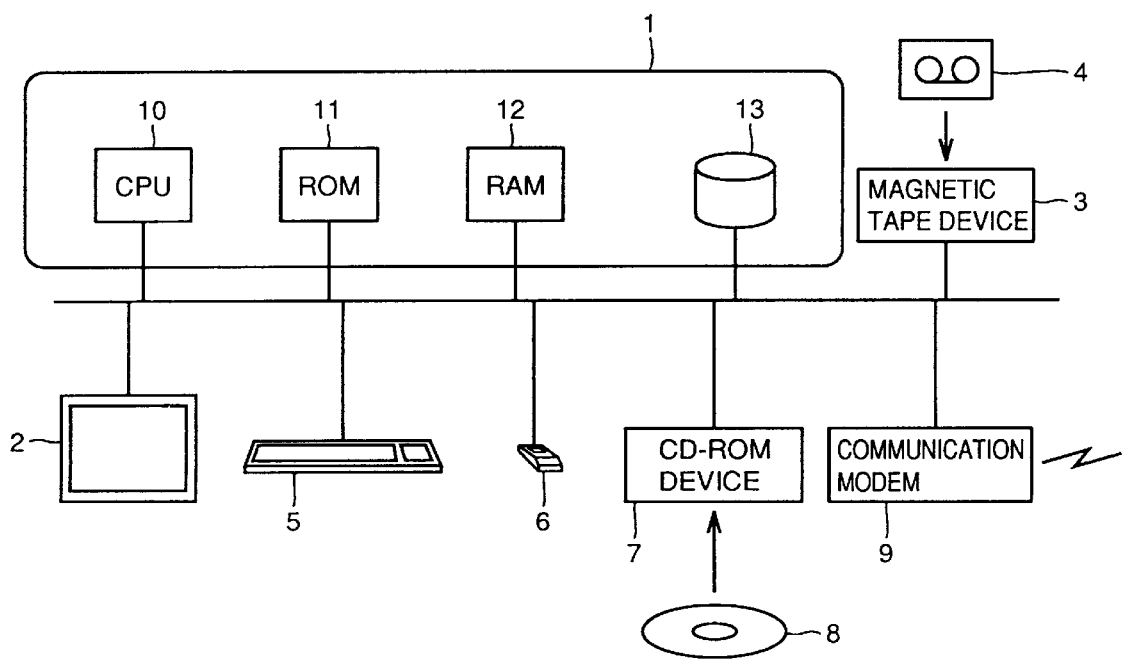
FIG. 6 is a block diagram showing a configuration of a pattern comparison inspection system according to the present invention.

Referring to FIG. 6, computer body 1 includes a CPU (Central Processing Unit) 10, an ROM (Read Only Memory) 11, an RAM (Random Assess Memory) 12 and a hard disc 13. CPU 10 inputs and receives data to and from graphic display device 2, magnetic tape 3, keyboard 5, mouse 6, CD-ROM device 7, communication modem 9, ROM 11, RAM 12 or hard disc 13 to perform processings. CPU 10 causes a pattern comparison inspection program recorded on magnetic tape 4 or CD-ROM 8 to be first stored in hard disc 13 via magnetic tape device 3 or CD-ROM device 7. CPU 10 appropriately loads RAM 12 with the pattern comparison inspection program from hard disc 13 and executes the pattern comparison inspection program for pattern comparison and inspection.

Hereinafter, a pattern comparison inspection system according to each embodiment of the present invention will be described. The appearance of the pattern comparison inspection system shown in FIG. 5 and the configuration block diagram of a pattern comparison inspection system shown in FIG. 6 are common among the embodiments.

First Embodiment

Figure 7:
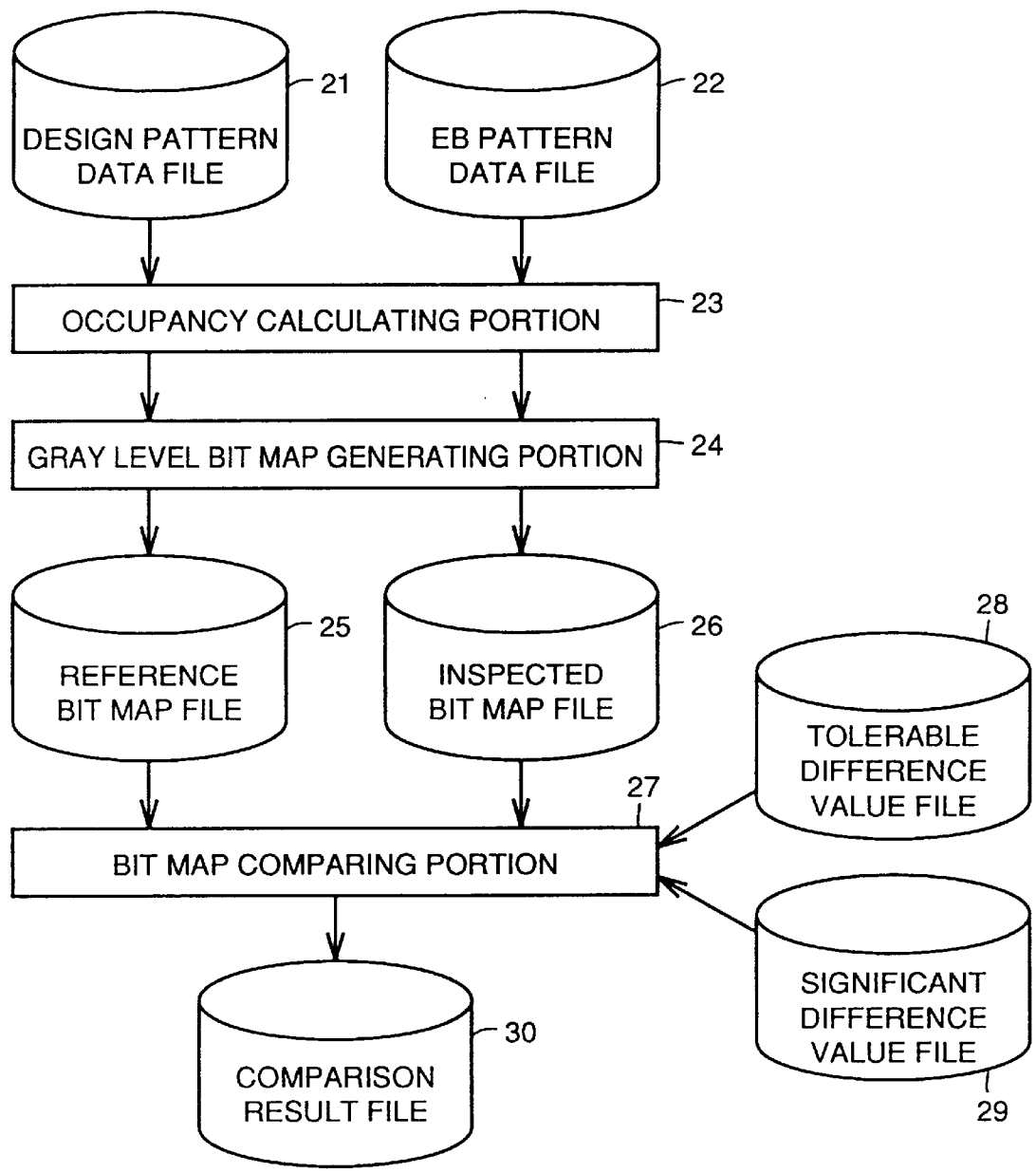
FIG. 7 is a block diagram showing a configuration of a pattern comparison inspection system according to a first embodiment of the present invention.

Referring to FIG. 7, a pattern comparison inspection system includes a design pattern data file 21 for storing design pattern data as a reference pattern for comparison and inspection, a pattern data for an electron beam patterning system (referred to as EB pattern data hereinafter) file 22 for storing EB pattern data as an inspected pattern in comparison and inspection, an occupancy calculating portion 23 for calculating ratio of a pattern occupying each pixel to each pixel from design pattern data or EB pattern data, a gray level bit map generating portion 24 for generating a bit map in gray level from a ratio of design pattern data or EB pattern data to each pixel obtained at occupancy calculating portion 23, a reference bit map file 25 for storing a gray level bit map generated from design pattern data (i.e., a reference bit map), an inspected bit map file 26 for storing a gray level bit map generated from EB pattern data (i.e., an inspected bit map), a bit map comparing portion 27 for comparing an inspected bit map with a reference bit map, a tolerable difference value file 28 for storing a tolerable difference value used in comparison and decision in bit map comparing portion 27, a significant difference value file 29 for storing a significant difference value used in comparison and decision in bit map comparing portion 27, and a comparison result file 30 for storing a comparison result in bit map comparing portion 27.

Occupancy calculating portion 23, gray level bit map generating portion 24 and bit map comparing portion 27 are stored as a pattern comparison inspection program into hard disc 13. Design pattern data file 21, EB pattern data file 22, reference bit map file 25, inspected bit map file 26, tolerable difference value file 28, significant difference value file 29 and comparison result file 30 have their respective file regions provided in hard disc 13.

Figure 8:
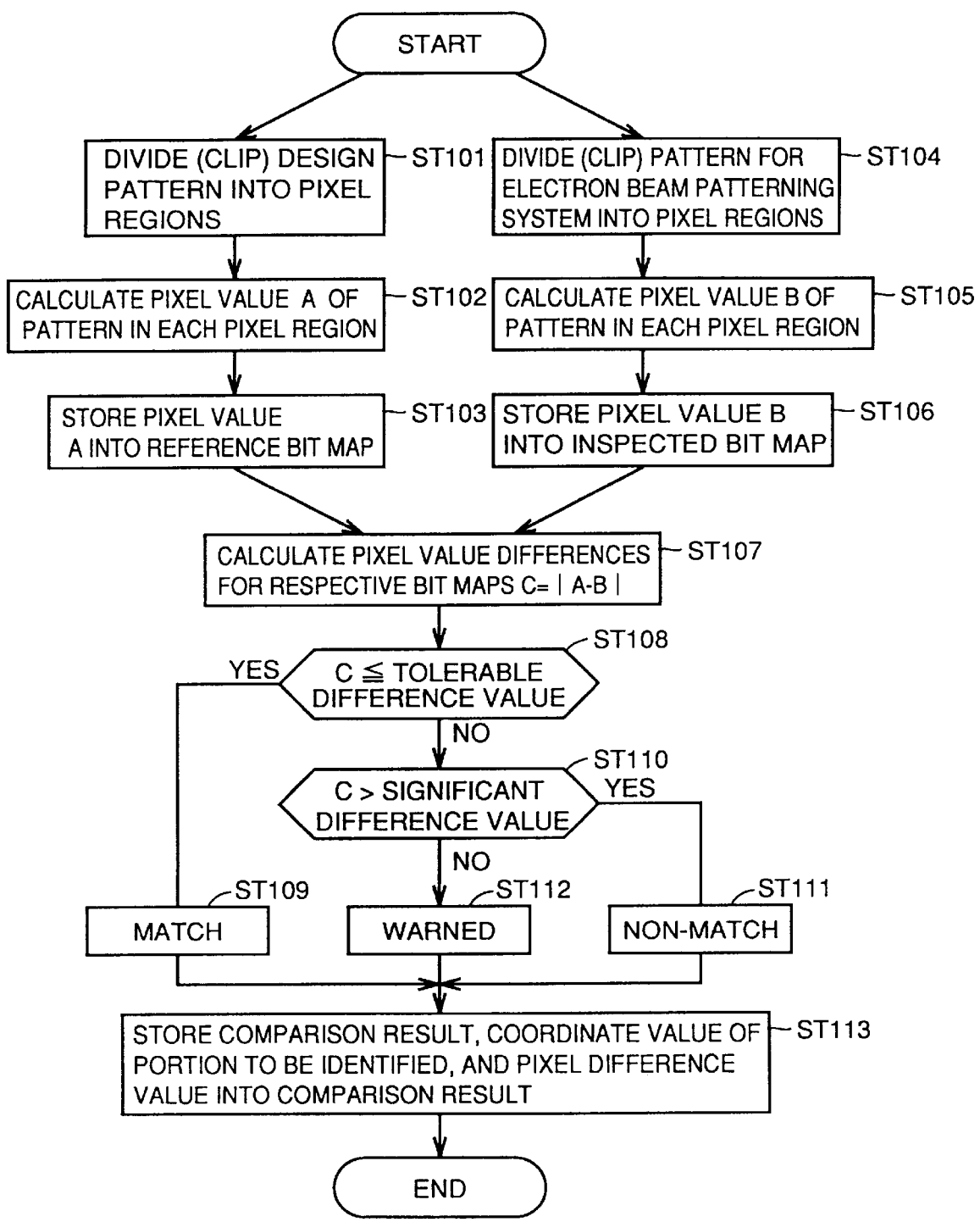
FIG. 8 is a flow chart illustrating a processing procedure of a pattern comparison inspection system according to the first embodiment.

Referring to FIG. 8, occupancy calculating portion 23 reads design pattern data from design pattern data file 21 and divides (i.e., clips) a pattern of the design pattern data into pixel regions (i.e., rectangular regions) (ST101). Then, occupancy calculating portion 23 calculates a ratio of each divided pattern to a pixel region (i.e., a gray level) as a pixel value a (ST102). Gray level bit map generating portion 24 generates a gray level bit map from the pixel value a of each divided pattern and stores the gray level bit map as a reference bit map into reference bit map file 25 (ST103).

Occupancy calculating portion 23 similarly reads EB pattern data from EB pattern data file 22 and divides (i.e., clips) a pattern of the EB pattern data into pixel regions (ST104). Then, occupancy calculating portion 23 calculates a ratio of each divided pattern to a pixel region as a pixel value b (ST105). Gray level bit map generating portion 24 generates a gray level bit map from the pixel value b of each divided pattern and stores the gray level bit map as an inspected bit map into inspected bit map file 26 (ST106).

Then, bit map comparing portion 27 calculates an absolute value c of a difference between each pixel value a stored in reference bit map file 25 and each pixel value b stored in inspected bit map file 26 which corresponds to each pixel value a (ST107). When a pixel value difference c does not exceed a tolerable difference value stored in tolerable difference value file 28 which corresponds to the pixel value difference c (ST108, YES), a decision is made that the pixel value a matches the pixel value b (ST109). When a pixel value difference c exceeds the tolerable difference value (ST108, NO), the pixel value difference c is compared with a significant difference value stored in significant difference value file 29 which corresponds to the pixel value difference c (ST110). If the pixel value difference c exceeding the tolerable difference value does not exceed the significant difference value (ST110, NO), a decision is made that it is warned so that it is separately identified (ST112). If the pixel value difference c exceeding the tolerable difference value exceeds the significant difference value (ST110, YES), a decision is made that the pixel value a does not match pixel value b (ST111). This decision is made for all pixels.

Finally, a decision result, a coordinate value of an identified portion (i.e., a pixel) and a pixel value difference c are stored as a comparison result into comparison result file 30 for each pixel (ST113).

Figure 9:
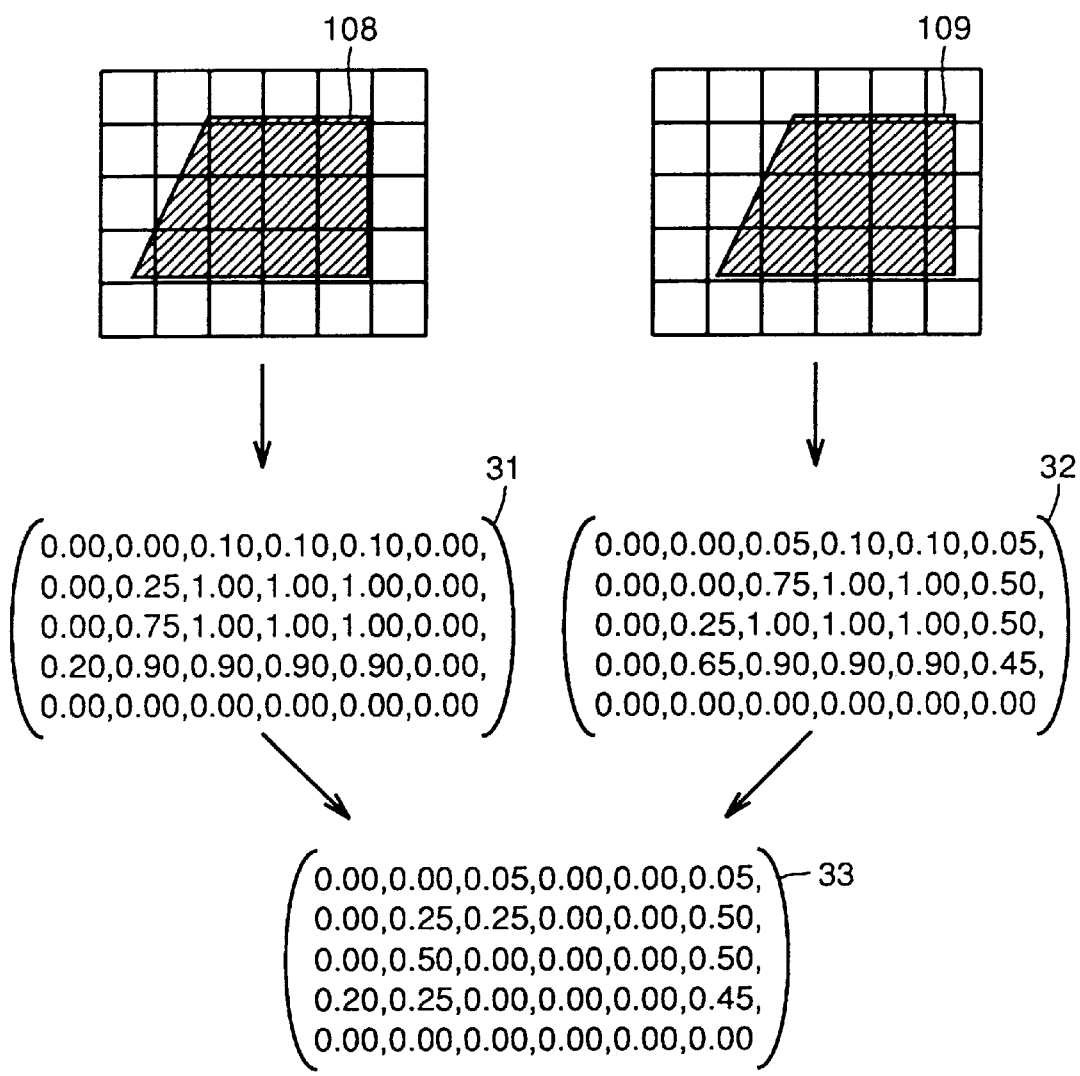
FIG. 9 shows a gray level bit map generated from design pattern data, a gray level bit map generated from EB pattern data, and a result of a comparison of the gray level bit maps.

Referring to FIG. 9, design pattern data 108 is converted into a gray level bit map (i.e., a reference bit map) 31 by occupancy calculating portion 23 and gray level bit map generating portion 24. EB pattern data 109 is also converted into a gray level bit map (i.e., an inspected bit map) 32. Bit map comparing portion 27 makes a comparison between reference bit map 31 and inspected bit map 32 and calculates an absolute value of each pixel value difference to generate a comparison result 33. It can be seen that the pixel value differences within comparison result 33 are all equal to or less than 0.50.

According to the present embodiment, bit map data represented by gray level can be thus generated from a reference pattern and an inspected pattern to represent any slight difference of patterns.

Furthermore, since a pixel value difference included in the respective gray level bit maps is compared with a tolerable difference value and a significant difference value, it can be automatically identified as a difference not substantially affecting mask quality or a difference disadvantageously affecting mask quality. Even when a sizing processing has been applied in using a state-of-the-art device, a tolerable difference value and a significant difference value can be set taking the sizing into consideration to automatically determine whether a pixel value difference results from the sizing and thus improve work efficiency in finding non-match portions by the designer.

Second Embodiment

Figure 10:
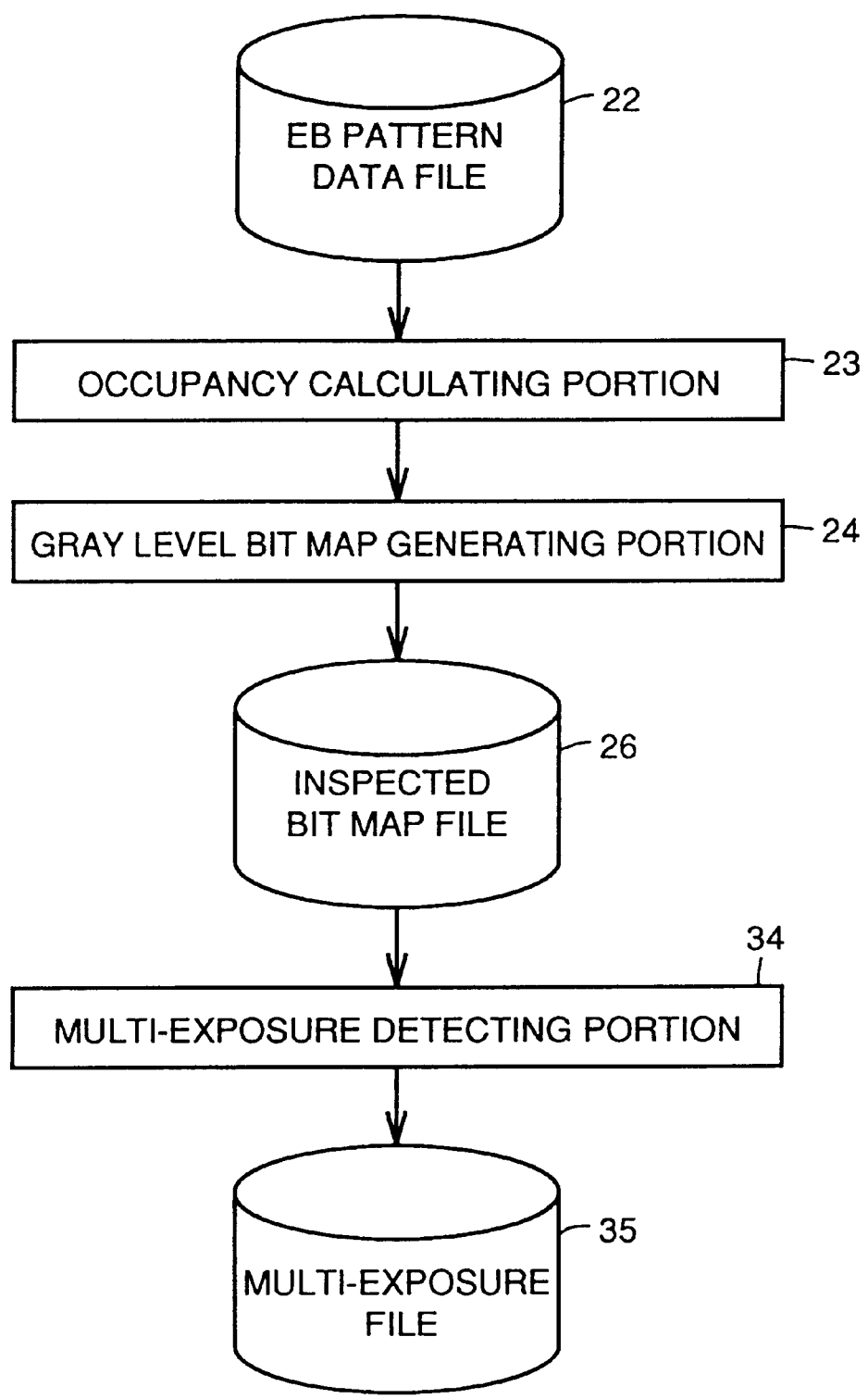
FIG. 10 is a block diagram showing a configuration of a pattern comparison inspection system according to a second embodiment of the present invention.

Referring to FIG. 10, EB pattern data file 22, occupancy calculating portion 23, gray level bit map generating portion 24 and inspected bit map file 26 are similar in function to those shown in FIG. 7 and a detailed description thereof is not repeated. Multi-exposure detect portion 34 detects that portion in an inspected bit map which has a pixel value exceeding a predetermined value, and stores the portion as a multi-exposed portion into a multi-exposure storing file 35.

As described in the BACKGROUND OF THE INVENTION, EB pattern data is provided so that a pattern by a combination of figures, such as triangles and rectangles, is drawn on a mask through exposure. Thus, the pixel value of a portion in which adjacent patterns overlap can exceed one. When the pixel having a pixel value exceeding one is drawn by an electron beam patterning system through exposure, energy of electron beam is increased. This causes degradation of mask quality and is especially problematic for a vector scan system electron beam patterning system producing a mask used for state-of-the-art devices.

Figure 11:
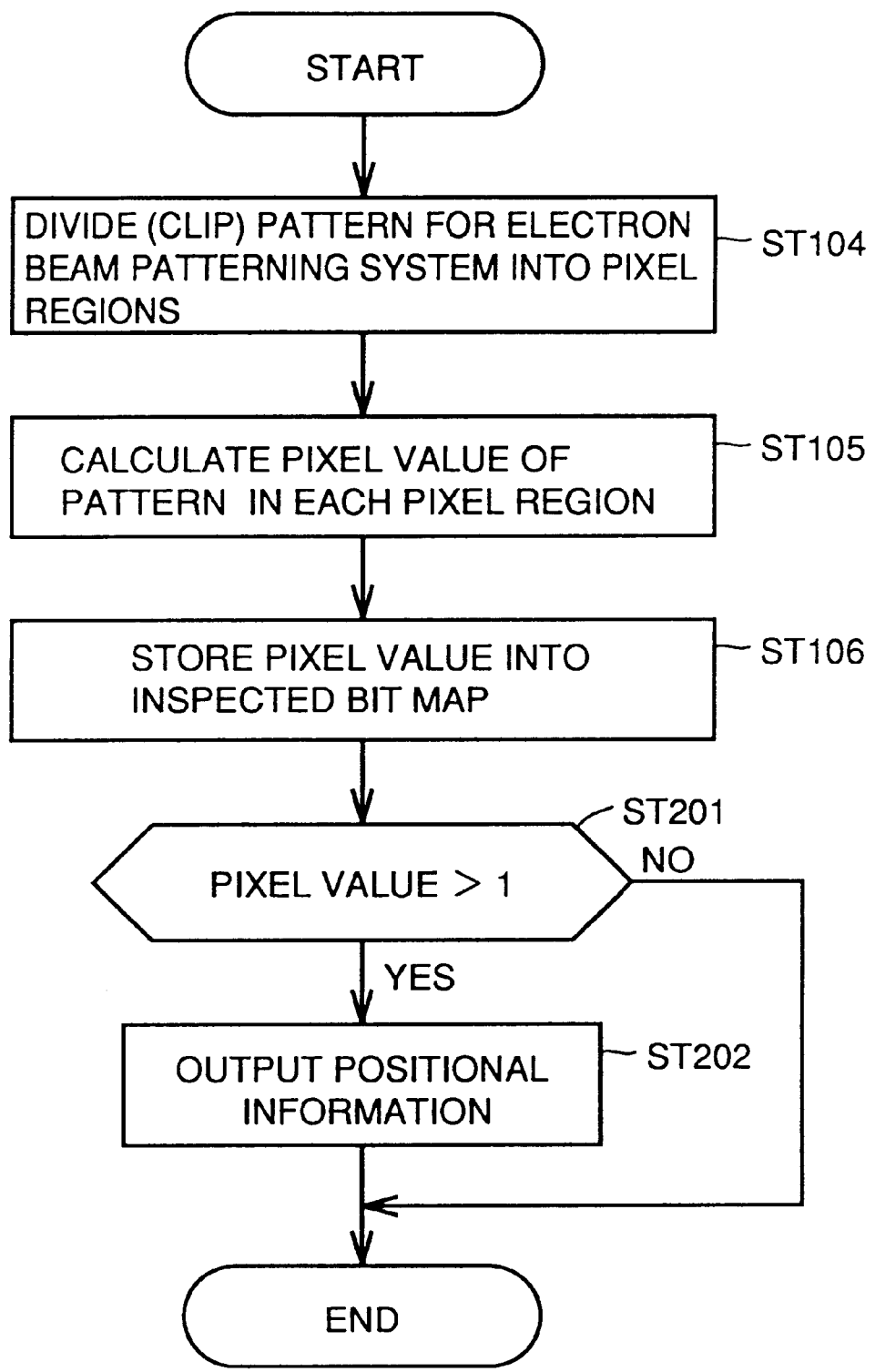
FIG. 11 is a flow chart illustrating a processing procedure of a pattern comparison inspection system according to the second embodiment.

Referring to FIG. 11, steps ST104–ST106 are the same as those of the processing procedure in the flow chart for the pattern comparison inspection device according to the first embodiment shown in FIG. 8 and thus a detailed description thereof is not repeated. Multi-exposure detect portion 34 reads an inspected bit map stored in inspected bit map file 26 and determines whether a pixel value exceeds one. If the pixel value does not exceed one (ST201, NO), the processing is completed. If the pixel value exceeds one (ST201, YES), the positional information of the pixel is stored into multi-exposure storing file 35 (ST202) and the processing is completed.

Figure 12:
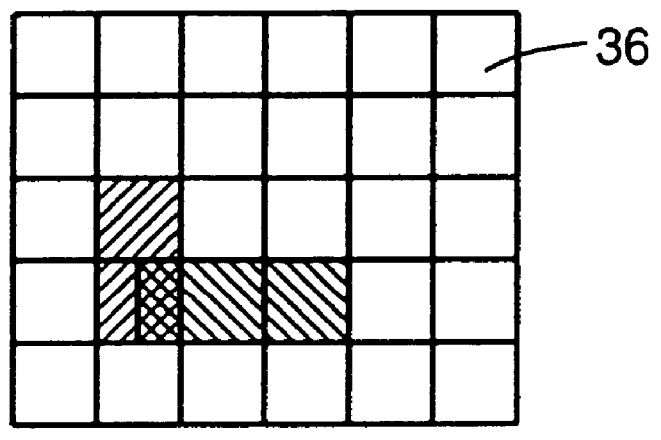
FIG. 12 shows a gray level bit map generated from EB pattern data.
Figure 12:

Referring to FIG. 12, as shown in EB pattern data 36, multi-exposure is caused in the pixel in the fourth row from the top and the second column from the left and the pixel value at the corresponding portion in an inspected bit map 37 exceeds one.

According to the present embodiment, pattern overlap thus can be detected and a multi-exposed portion can be detected in using a vector scan system electron beam patterning system producing a mask used for state-of-the-art devices. Thus, degradation in quality of a pattern in a mask caused by multi-exposure can be found in advance.

Third Embodiment

Figure 13:
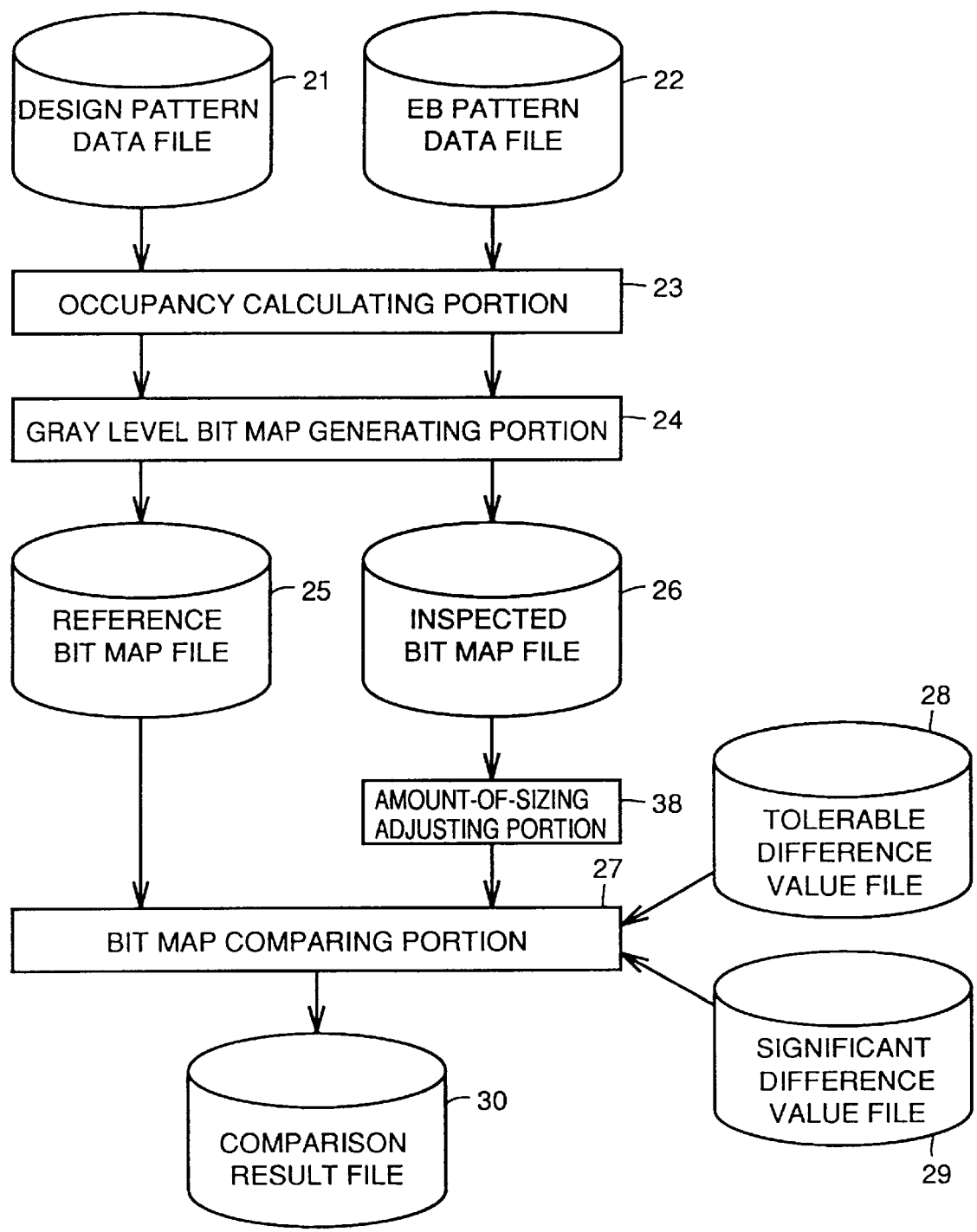
FIG. 13 is a block diagram showing a configuration of a pattern comparison inspection system according to a third embodiment of the present invention.

FIG. 13 shows a pattern comparison inspection system which differs from that according to the first embodiment only in that an amount-of-sizing adjusting portion 38 is provided between inspected bit map file 26 and bit map comparing portion 27. The portion other than amount-of-sizing adjusting portion 38 is the same in function as that of the pattern comparison inspection system according to the first embodiment shown in FIG. 7 and thus a detailed description thereof is not repeated. If an inspected pattern is a uniformly sized version of a reference pattern, amount-of-sizing adjusting portion 38 adjusts the difference which the inspected bit map has due to the uniform sizing. Uniform sizing means sizing all patterns by a same amount of sizing. An amount of sizing is a value representing how much a distance from the profile of a pattern to the barycenter is enlarged or reduced in the vertical and horizontal directions.

Figure 14:
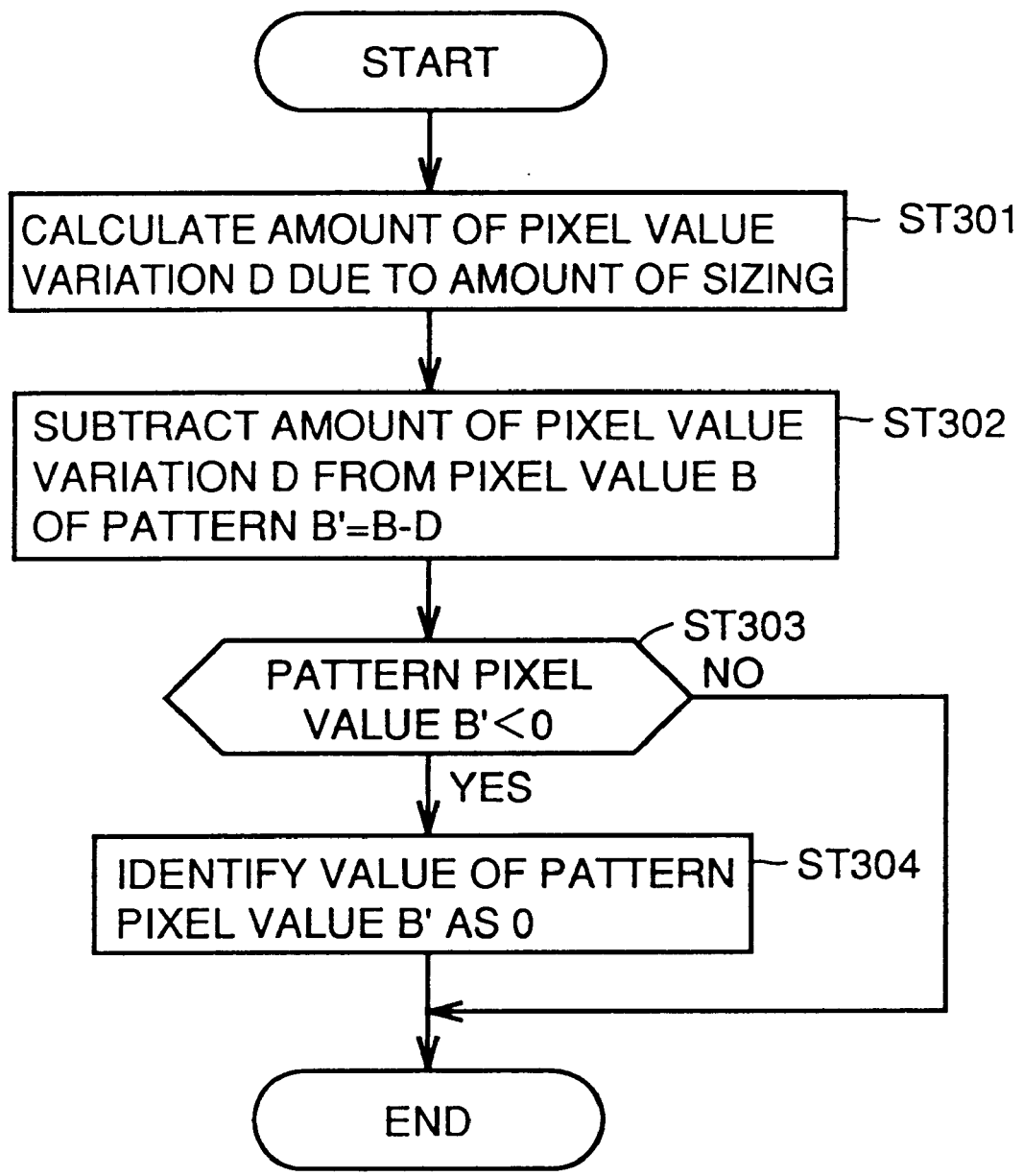
FIG. 14 is a flow chart illustrating a processing procedure of a pattern comparison inspection system according to the third embodiment.

A processing procedure of a pattern comparison inspection system according to the third embodiment is illustrated by the flow chart illustrating the processing procedure of the pattern inspection comparison system according to the first embodiment shown in FIG. 8 wherein steps ST301–ST304 in the flow chart shown in FIG. 14 are inserted between steps ST106 and ST107, and thus detailed descriptions of the overlapping steps are not repeated.

Amount-of-sizing adjusting portion 38 calculates an amount of variation d in pixel value in a pixel region from an amount of sizing and the length of one side of the pixel region (ST301). An amount of variation d in pixel value is obtained by the following equation:

$$\text{an amount of variation d in pixel value} = \text{an amount of sizing/the length of one side of a pixel region} \quad (1).$$

Then, an amount of pixel value variation d is subtracted from a pixel value b of an inspected bit map to obtain a pixel value b' (ST302). Then if the pixel value b' is less than zero (ST303, YES), the pixel value b' is identified as zero (ST304). If the pixel value b' is equal to or more than zero (ST303, NO), the pixel value b' is not changed. Each pixel value b' thus obtained is used as a pixel value b of the inspected bit map to perform the processing after step ST107.

Figure 15:
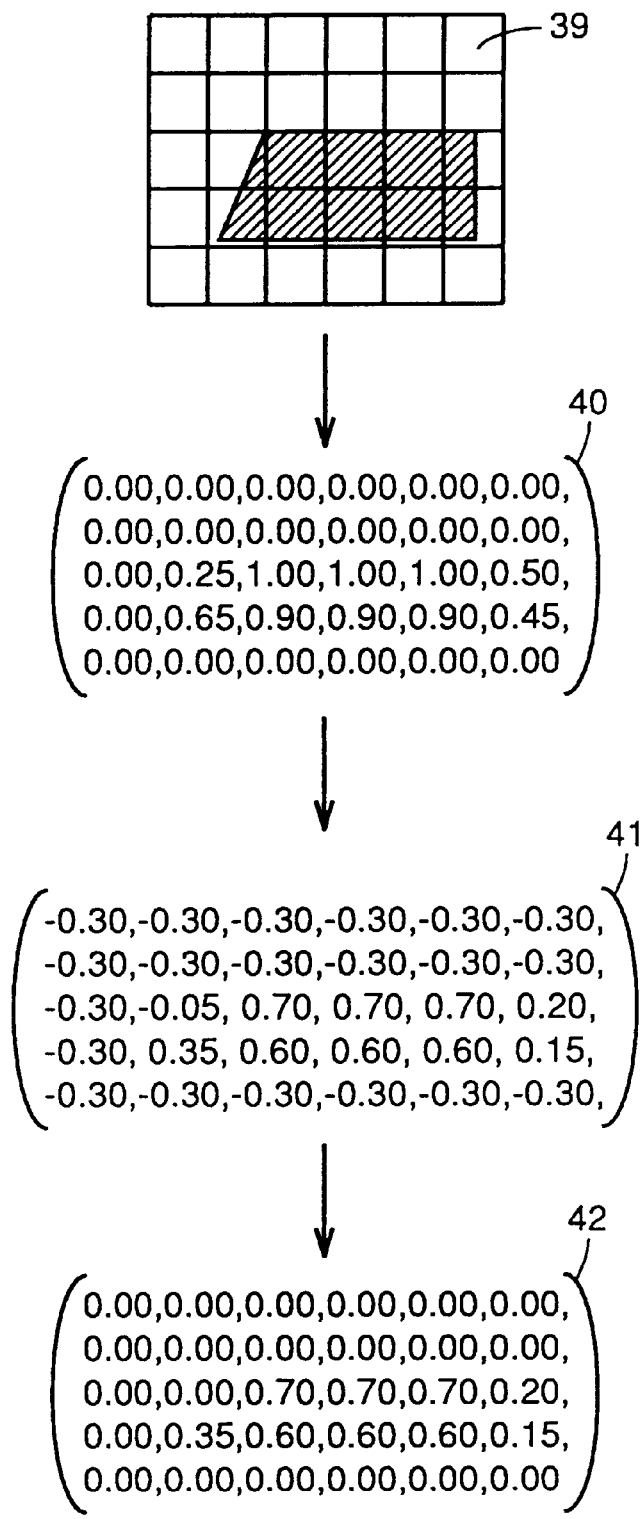
FIG. 15 shows an inspected bit map generated from EB pattern data, a bit map obtained by subtracting an amount of pixel value variation d from the inspected bit map, and an inspected bit map in which an amount of sizing has been adjusted.

Referring to FIG. 15, an amount of pixel value variation d is subtracted from each pixel value of an inspected bit map 40 generated from EB pattern data 39, to produce a bit map 41. It is noted that the sizing is enlarging in the vertical and horizontal directions from the barycenter of a pattern by the length of one side of the pixel region multiplied by 0.3. Any pixel value among pixel values in bit map 41 which is less than zero is changed to zero to generate an inspected bit map 42 in which the amount of sizing has been adjusted. It should be noted that each pixel value within inspected bit map 42 is reduced from that of inspected bit map 40 by 0.30 and thus the profile has been reduced.

According to the present embodiment, an amount of uniform sizing can be thus adjusted in comparing and inspecting EB pattern data after the uniform sizing processing has been applied for improving finished precision of a mask for state-of-the-art devices. Thus, only a true non-match portion can be detected and the work efficiency of the designer in finding non-match portions can be improved.

Fourth Embodiment

Figure 16:
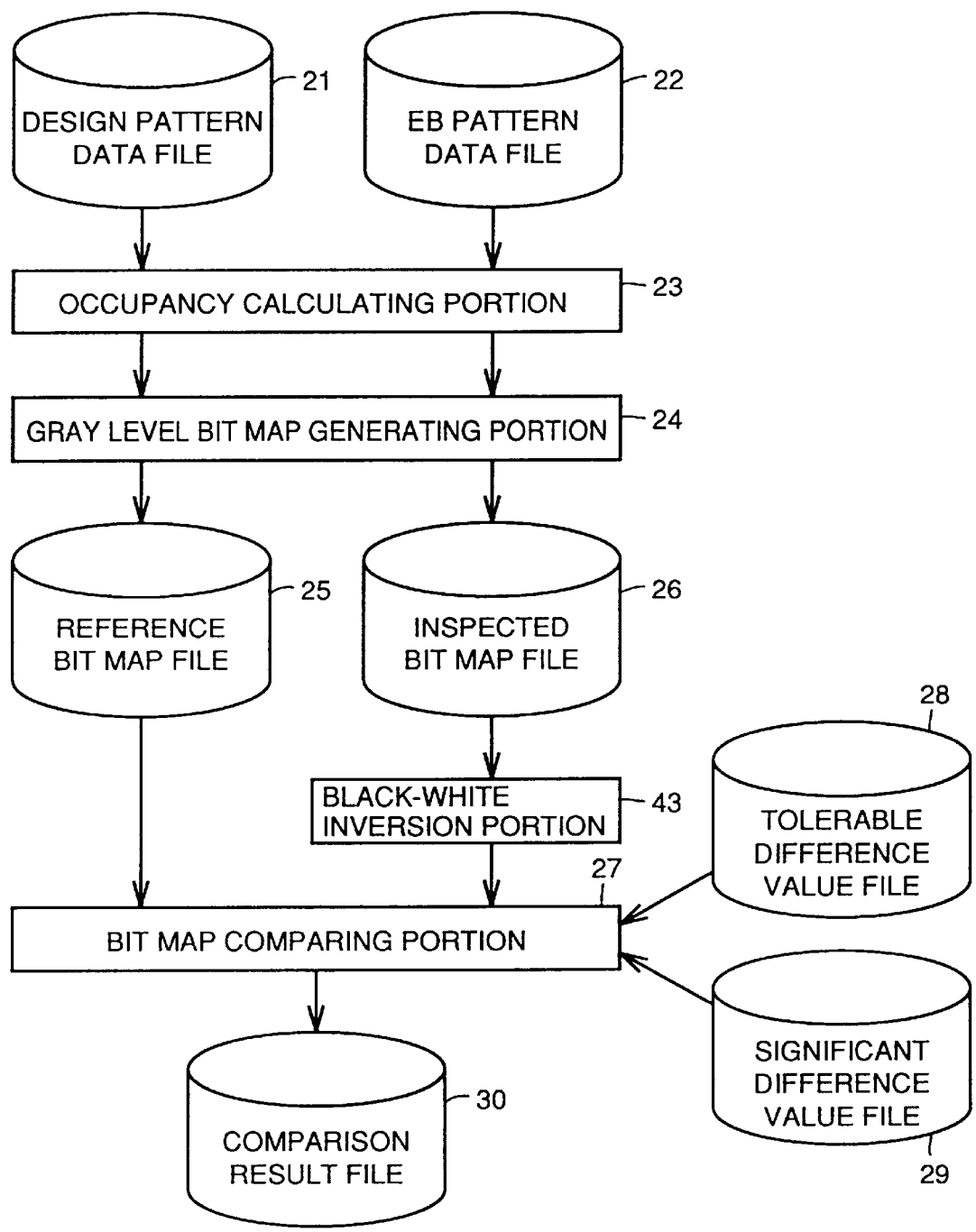
FIG. 16 is a block diagram showing a configuration of a pattern comparison inspection system according to a fourth embodiment of the present invention.

Referring to FIG. 16, the pattern comparison inspection system differs from that according to the first embodiment shown in FIG. 7 only in that a black-white inverting portion 43 is added between inspected bit map file 26 and bit map comparing portion 27. The portion other than black-white inverting portion 43 is the same in function as that of the pattern comparison inspection system according to the first embodiment shown in FIG. 7, and thus a detailed description thereof is not repeated. Black-white inverting portion 43 inverts and outputs the gray level of each pixel value b of an inspected bit map.

Figure 17:
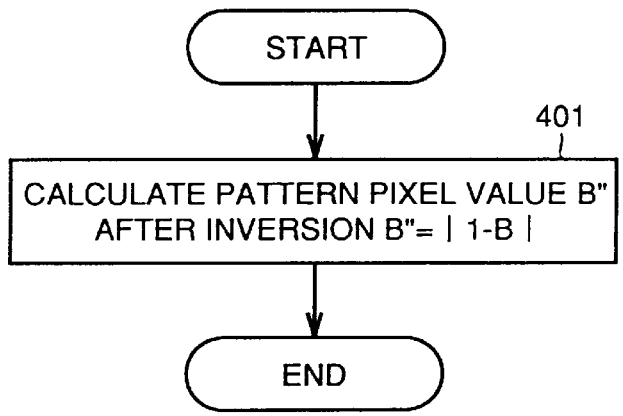
FIG. 17 is a flow chart illustrating a processing procedure of a pattern comparison inspection system according to the fourth embodiment of the present invention.

A processing procedure of the pattern comparison inspection system according to the fourth embodiment is illustrated by the flow chart illustrating the processing procedure of the pattern comparison inspection system according to the first embodiment shown in FIG. 8 wherein step ST401 in the flow chart shown in FIG. 17 is inserted between steps ST106 and ST107, and thus detailed descriptions of the overlapping steps are not repeated.

Black-white inverting portion 43 subtracts each pixel value b of an inspected bit map from one to obtain an absolute value as a pixel value b" of an inverted version of the inspected bit map (ST401). Then, a pixel value b" of the inverted version of the inspected bit map is used as a pixel value of the inspected bit map to perform the processing after step ST107.

Figure 18:
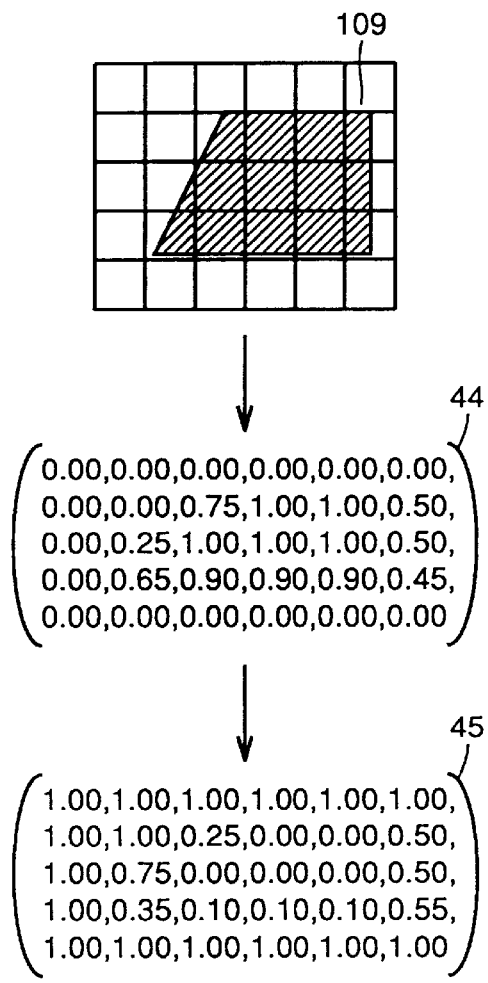
FIG. 18 shows an inspected bit map generated from EB pattern data, and an inverted version thereof.

Referring to FIG. 18, each pixel value of inspected bit map 44 generated from EB pattern data 109 is inverted to generate an inverted inspected bit map 45.

According to the present embodiment, black-white inversion in a gray level bit map can be thus performed in comparing and inspecting black-white inverted EB pattern data used for a vector scan system electron beam patterning system used for state-of-the-art devices. Thus, only a true non-match portion can be detected, and the work efficiency of the designer in finding non-match portions can be improved.

Fifth Embodiment

Figure 19:
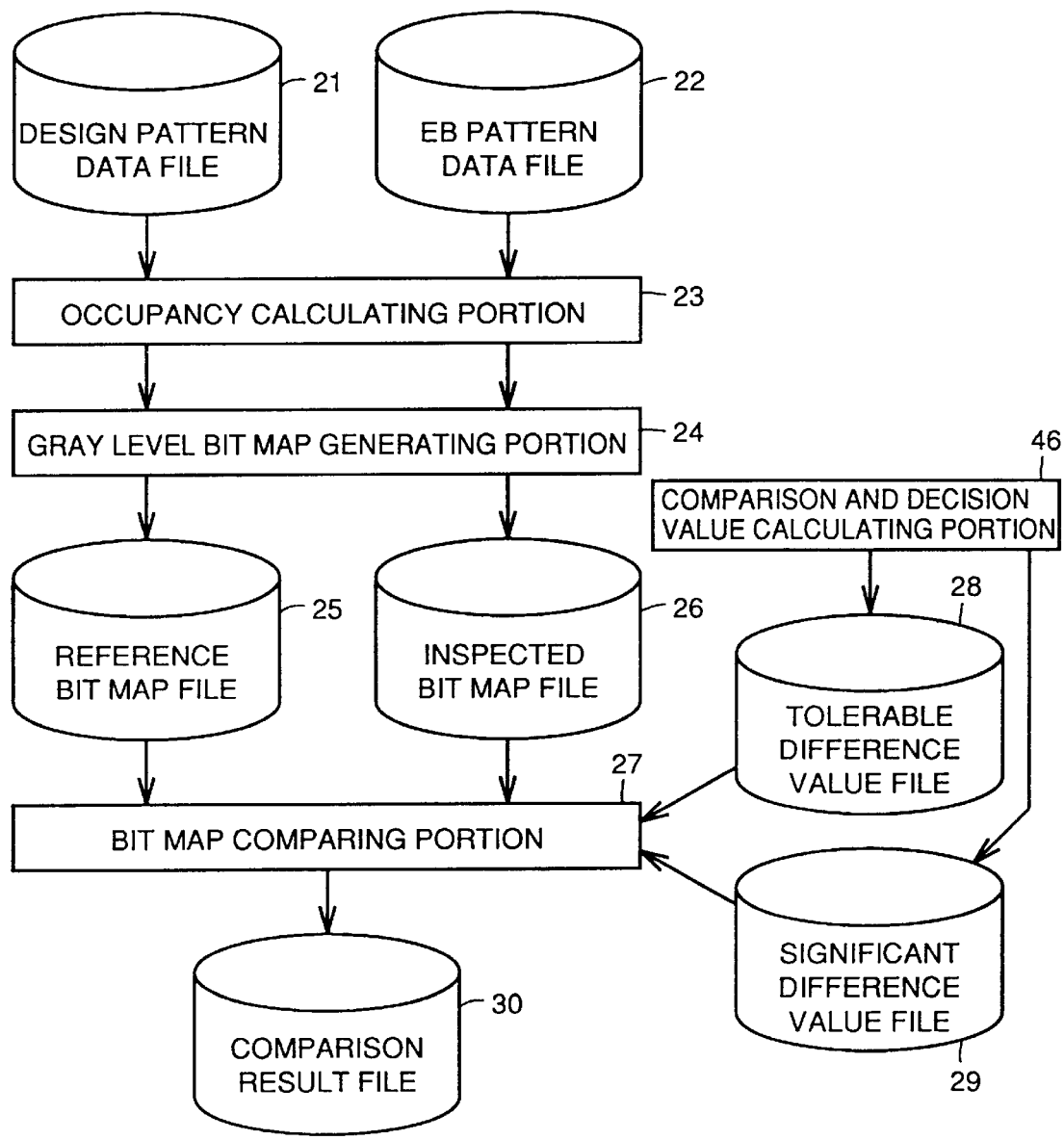
FIG. 19 is a block diagram showing a configuration of a pattern comparison inspection system according to a fifth embodiment of the present invention.

Referring to FIG. 19, the pattern comparison inspection system differs from that according to the first embodiment shown in FIG. 7 only in that it is also provided with a comparison and decision value calculating portion 46. The portion other than comparison and decision value calculating portion 46 is the same in function as that of the pattern comparison inspection system according to the first embodiment shown in FIG. 7, and thus a detailed description thereof is not repeated. Comparison and decision value calculating portion 46 calculates a tolerable difference value and a significant difference value used when bit map comparing portion 27 makes a comparison between a reference bit map and an inspected bit map. The calculated tolerable difference value and significant difference value are stored into a tolerable difference value file 28 and a significant difference value file 29, respectively.

Figure 20:
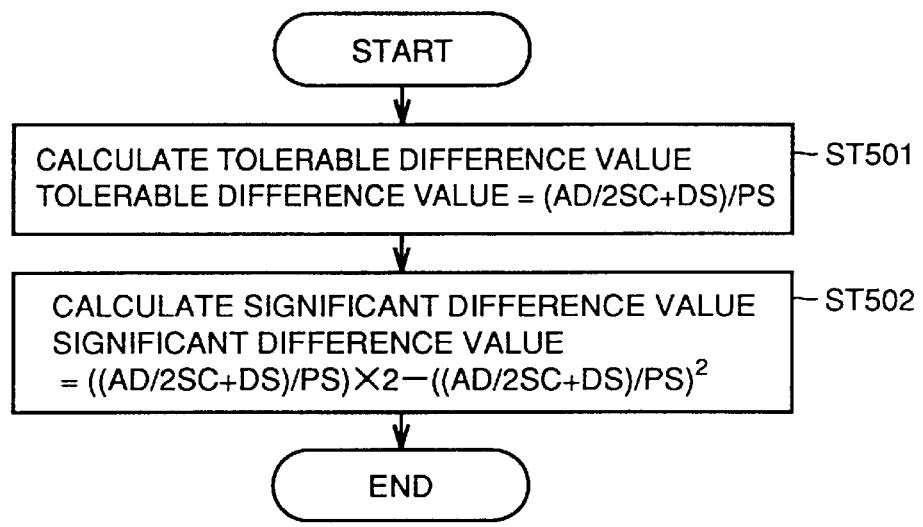
FIG. 20 is a flow chart illustrating a processing procedure of a pattern comparison inspection system according to the fifth embodiment of the present invention.

A processing procedure of the pattern comparison inspection system according to the fifth embodiment is illustrated by the flow chart illustrating the processing procedure of the pattern comparison inspection system according to the first embodiment shown in FIG. 8 wherein steps ST501 and ST502 in the flow chart shown in FIG. 20 are inserted between steps ST107 and ST108, and thus detailed descriptions of the overlapping steps are not repeated.

Comparison and decision value calculating portion 46 calculates a tolerable difference value, using the following equation (ST501):

$$\text{Tolerable difference value} = ((AD/2SC+DS) \times PS)/PS^2 = (AD/2SC+DS)/PS \quad (2),$$

wherein AD represents an address unit value of an electron beam patterning system (i.e., a step value of electron beam), SC represents a writing magnification of the electron beam patterning system, PS represents the length of one side of a pixel region (referred to as a pixel size hereinafter), and DS represents an amount of sizing.

Figure 21:
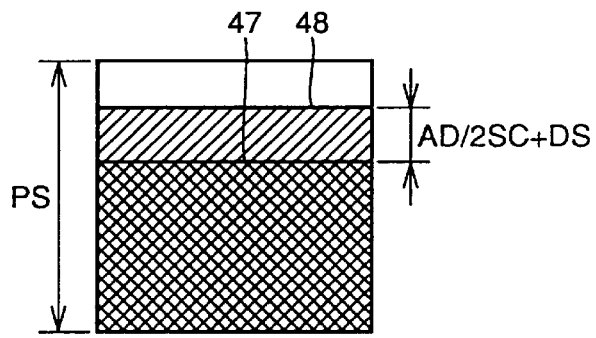
FIG. 21 is a view for illustrating a method of calculating a tolerable difference value.

Referring to FIG. 21, upward expanding of EB pattern data 48 relative to design pattern data 47 by $AD/2SC+DS$ is tolerated. More specifically, the size of electron beam can be changed only step by step by a predetermined step value AD and thus when the center of electron beam is to be positioned at an edge of the perimeter of design pattern data 47, the perimeter of EB pattern data 48 is displaced by at most $AD/2SC$, to which an amount of sizing DS is added. An maximum amount of movement $AD/2SC+DS$ of each side of EB pattern data 48 relative to design pattern data 47 thus obtained is referred to as a grid size. Thus, a tolerable difference value is represented by the ratio of "the areal difference between design pattern data 47 and EB pattern data 48 having a maximum tolerable displacement at its edge" to the area of the pixel region.

Then, comparison and decision value calculating portion 46 calculates a significant difference value according to the following equation (ST502):

$$\text{Significant difference value} = (((AD/2SC+DS) \times PS)/PS^2) \times 2 - ((AD/2SC+DS)/PS)^2 = ((AD/2SC+DS)/PS) \times 2 - ((AD/2SC+DS)/PS)^2 \quad (3)$$

wherein AD represents the address unit value of the electron beam patterning system, SC represents the writing magnification of the electron beam patterning system, PS represents the pixel size, and DS represents the amount of sizing.

Figure 22:
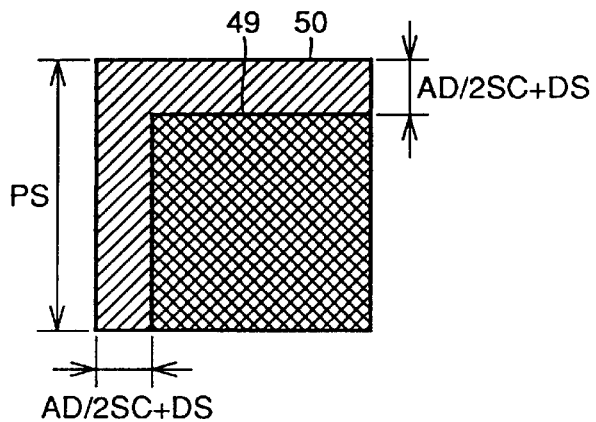
FIG. 22 is a view for illustrating a method of calculating a significant difference value.

Referring to FIG. 22, while a tolerable difference value is a value in a case where there is a possible maximum displacement when a side of design pattern data 47 is included in a pixel region, as shown in FIG. 21, a significant difference value is a value in a case where a corner of design pattern data 49 is included in a pixel region. A significant difference value is provided by equation (3) as a ratio of "the area difference between design pattern data 49 and EB pattern data 50 having a maximum tolerable displacement at a corner thereof" to the area of a pixel region.

Comparison and decision value calculating portion 46 stores the obtained tolerable difference value and significant difference value into tolerable difference value file 28 and significant difference value file 29, respectively, and then performs the processing from step ST108 downward of the flow chart shown in FIG. 8.

According to the present embodiment, a tolerable difference value and a significant difference value can be thus obtained from an address unit value, a writing magnification, a pixel size and an amount of sizing to quantitatively identify a difference as a difference not substantially affecting mask quality or a difference disadvantageously affecting mask quality.

Sixth Embodiment

A pattern comparison inspection system according to a sixth embodiment of the present invention is the same in configuration as the pattern comparison inspection system according to the third embodiment shown in FIG. 13, except for the function of amount-of-sizing adjusting portion 38. Hereinafter, an amount-of-sizing adjusting portion according to the present embodiment is designated by a reference numeral 38'. Amount-of-sizing adjusting portion 38' detects a pixel of a peripheral edge within an inspected bit map and adjusts only the pixel value of the pixel of the peripheral edge.

Figure 23:
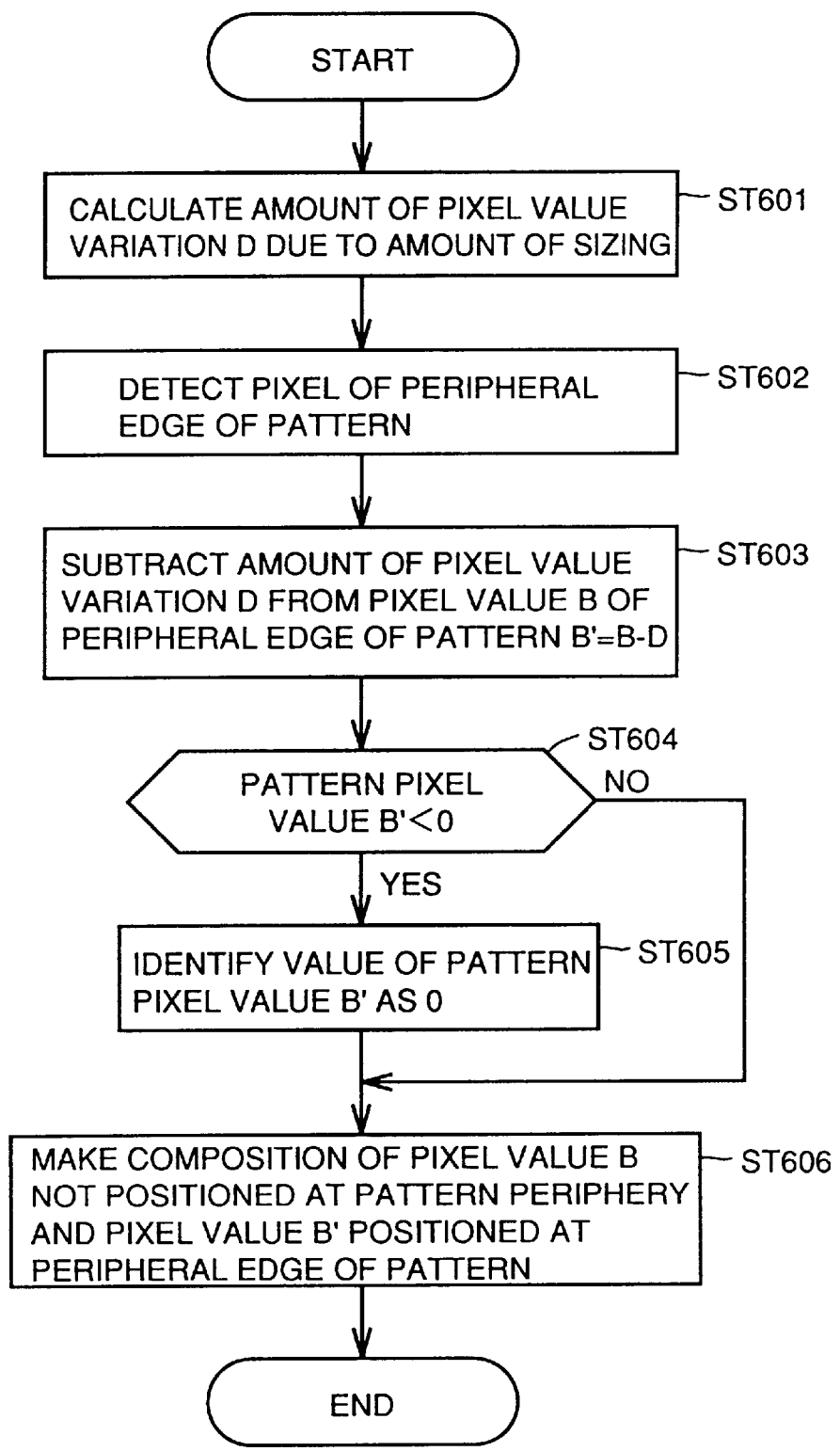
FIG. 23 is a flow chart illustrating a processing procedure of a pattern comparison inspection system according to a sixth embodiment of the present invention.

A processing procedure of the pattern comparison inspection system according to the sixth embodiment is represented by the flow chart illustrating the processing procedure of the pattern comparison inspection system according to the first embodiment shown in FIG. 8 wherein steps ST601–ST606 in the flow chart shown in FIG. 23 are inserted between steps ST106 and ST107, and thus detailed descriptions of the overlapping steps are not repeated.

Amount-of-sizing adjusting portion 38' calculates an amount of pixel value variation d according to equation (1) (ST601). Then, an inspected bit map is referred to, to detect a pixel of the peripheral edge of a pattern (ST602). More specifically, among pixel values b of an inspected bit map, a pixel adjacent at its upper, lower, right and left sides to pixels each having a value other than zero is not identified as a pixel of the peripheral edge. A pixel is otherwise identified as a pixel of the peripheral edge as long as its pixel value is not zero.

Then, the amount of pixel value variation d is subtracted from a pixel value b of the peripheral edge of the pattern to obtain a pixel value b' (ST603). Then, if a pixel value b' is less than zero (ST604, YES), the pixel value b' is identified as zero (ST605). If a pixel value b' is equal to or more than zero (ST604, NO), the pixel value b' is not changed. Finally, a composition of a pixel value b of the portion other than the peripheral edge of the pattern and a pixel value b' of the peripheral edge of the pattern is made (ST606). A pixel value thus composed is used as a pixel value b of the inspected bit map to perform the processing from step ST107 onward.

Figure 24:
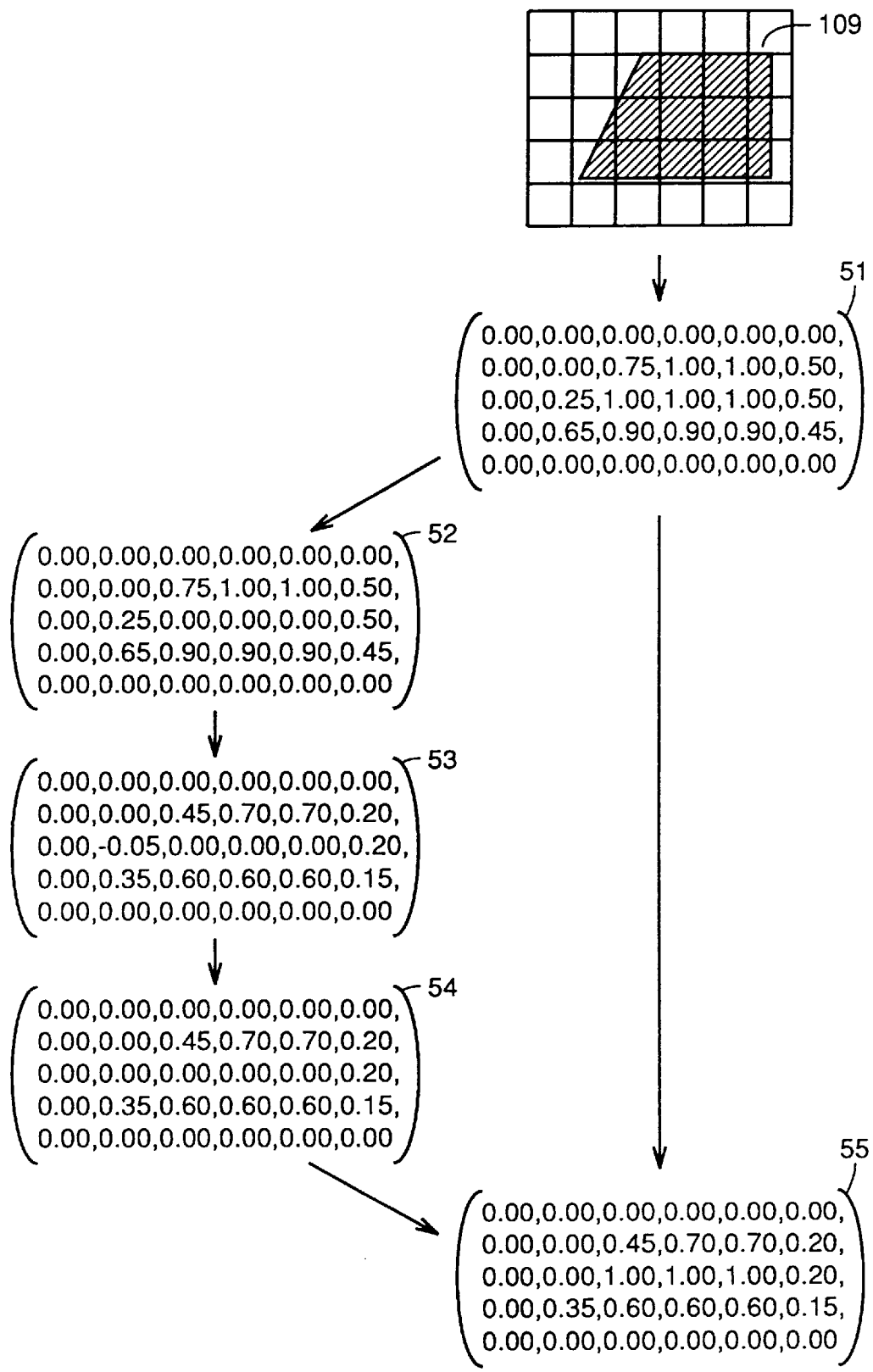
FIG. 24 is a diagram for illustrating a method of adjusting only a peripheral edge of a pattern.

Referring to FIG. 24, among pixel values of an inspected bit map generated from EB pattern data, the pixel value of a pixel adjacent at its upper, lower, right and left sides to pixels each having a value other than zero is changed to zero to generate a bit map 52. That is, bit map 52 indicates pixel values of only the peripheral edge of a pattern. Then, an amount of pixel value variation d is subtracted from each pixel value of the peripheral edge of bit map 52 to generate a bit map 53. It is noted that the sizing is enlarging in the vertical and horizontal directions from the barycenter of the pattern by the length of one side of the pixel region multiplied by 0.3.

Then, any pixel value in bit map 53 smaller than zero is changed to zero to produce a bit map 54. Finally, a composition of inspected bit map 51 and bit map 54 is made to generate an inspected bit map 55 in which only the peripheral edge of the pattern is adjusted. It should be noted that each pixel value of the peripheral edge within inspected bit map 55 is reduced by 0.30 as compared with inspected bit map 51 and that the profile has been reduced.

According to the present embodiment, adjustment of an amount of uniform sizing can be thus performed in comparing and inspecting EB pattern data after the uniform sizing processing for improving finished precision of a mask for state-of-the-art devices has been applied. Thus, only a true non-match portion can be detected and the designer's work efficiency in finding non-match portions can be improved.

Seventh Embodiment

A pattern comparison inspection system according to a seventh embodiment of the present invention is the same in configuration as the pattern comparison inspection system according to the first embodiment shown in FIG. 7, except for the function of bit map comparing portion 27. The bit map comparing portion according to the present embodiment is designated by a reference numeral 27'.

Figure 25:
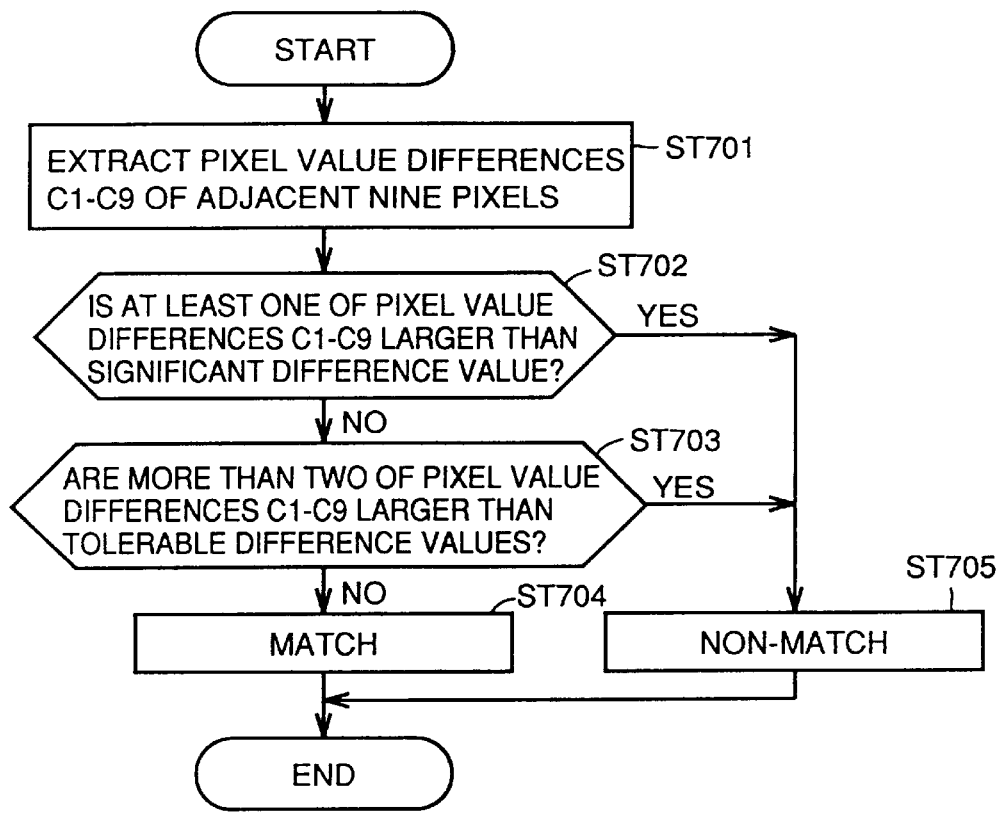
FIG. 25 is a flow chart illustrating a processing procedure of a pattern comparison inspection system according to a seventh embodiment of the present invention.

A processing procedure of the pattern comparison inspection system according to the seventh embodiment is illustrated by the flow chart illustrating the processing procedure of the pattern comparison inspection system according to the first embodiment shown in FIG. 8 wherein step ST112 is substituted with steps ST701–ST705 in the flow chart shown in FIG. 25. More specifically, a pixel identified as warned by the pattern comparison inspection system according to the first embodiment is further identified in detail.

Bit map comparing portion 27' extracts differences $c_1$–$c_9$ for a pixel to be identified and its adjacent eight pixels between pixel values a of the nine pixels of a reference bit map and pixel values b of the nine pixels of an inspected bit map (ST701). Pixel value differences $c_1$–$c_9$ are each compared with a significant difference value corresponding to each pixel value difference. If at least one pixel value difference is larger than the significant difference value (ST702, YES), the pixel to be identified is identified as non-match (ST705). When there is no pixel value difference larger than the significant difference value (ST702, NO), the pixel value differences $c_1$–$c_9$ are each compared with a tolerable difference value corresponding to each pixel value difference. If there are more than two pixel value differences larger than their tolerable difference values (ST703, YES), the pixel to be identified is identified as non-match (ST705). If the number of pixel value differences larger than their tolerable difference values is smaller than three (ST703, NO), the pixel to be identified is identified as match (ST704). At most two pixel value differences larger than their tolerable difference values are tolerated, since adjacent nine pixels can include two corners of a pattern. More specifically, adjacent nine pixels can include two corners of a pattern when a width of the pattern is approximately equal to the length of one side of a pixel region.

Figure 26:
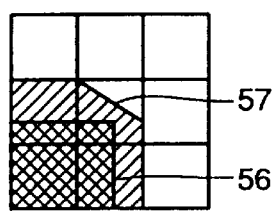
FIG. 26 shows one example of a pattern when there is a difference in pixel value larger than a significant difference value among nine adjacent pixels.
Figure 26:
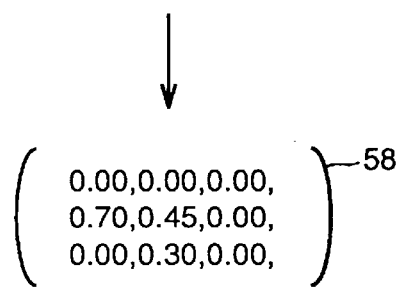

Referring to FIG. 26, when the significant difference values of the nine pixels are all 0.50, the center pixel to be identified is identified as non-match since a pixel value difference larger than 0.50 is included in a bit map 58.

Figure 27:
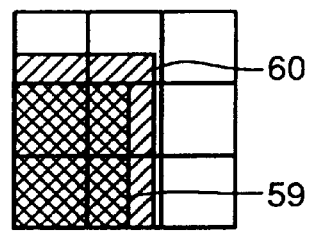
FIG. 27 shows one example of a pattern when there are more than two differences in pixel value larger than a tolerable difference value among nine adjacent pixels.
Figure 27:

Referring to FIG. 27, when the tolerable difference values of the nine pixels are all 0.30, the center pixel to be identified is identified as non-match since four pixel value differences larger than 0.30 are included in a bit map 61.

Figure 28:
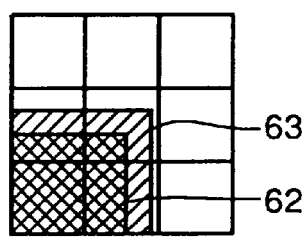
FIG. 28 shows one example of a pattern when there is one difference in pixel value larger than a tolerable difference value among nine adjacent pixels.
Figure 28:

Referring to FIG. 28, when the tolerable difference values of the nine pixels are all 0.30, the central pixel to be identified is identified as match since only one pixel value difference larger than 0.30 is included in a bit map 64.

As described above, according to the present embodiment, the pixel value differences of adjacent nine pixels are each compared with a tolerable difference value or a significant difference value to automatically identify the pixel value difference of a pixel warned as a difference resulting from a corner which does not substantially affect mask quality or a difference disadvantageously affecting mask quality and thus to improve the designer's working efficiency in finding non-match portions.

Eighth Embodiment

A pattern comparison inspection system according to an eighth embodiment of the present invention is the same in configuration as the pattern comparison inspection system according to the third embodiment shown in FIG. 13, except for the function of amount-of-sizing adjusting portion 38. The amount-of-sizing adjusting portion according to the present embodiment is designated by a reference numeral 38".

Figure 1:
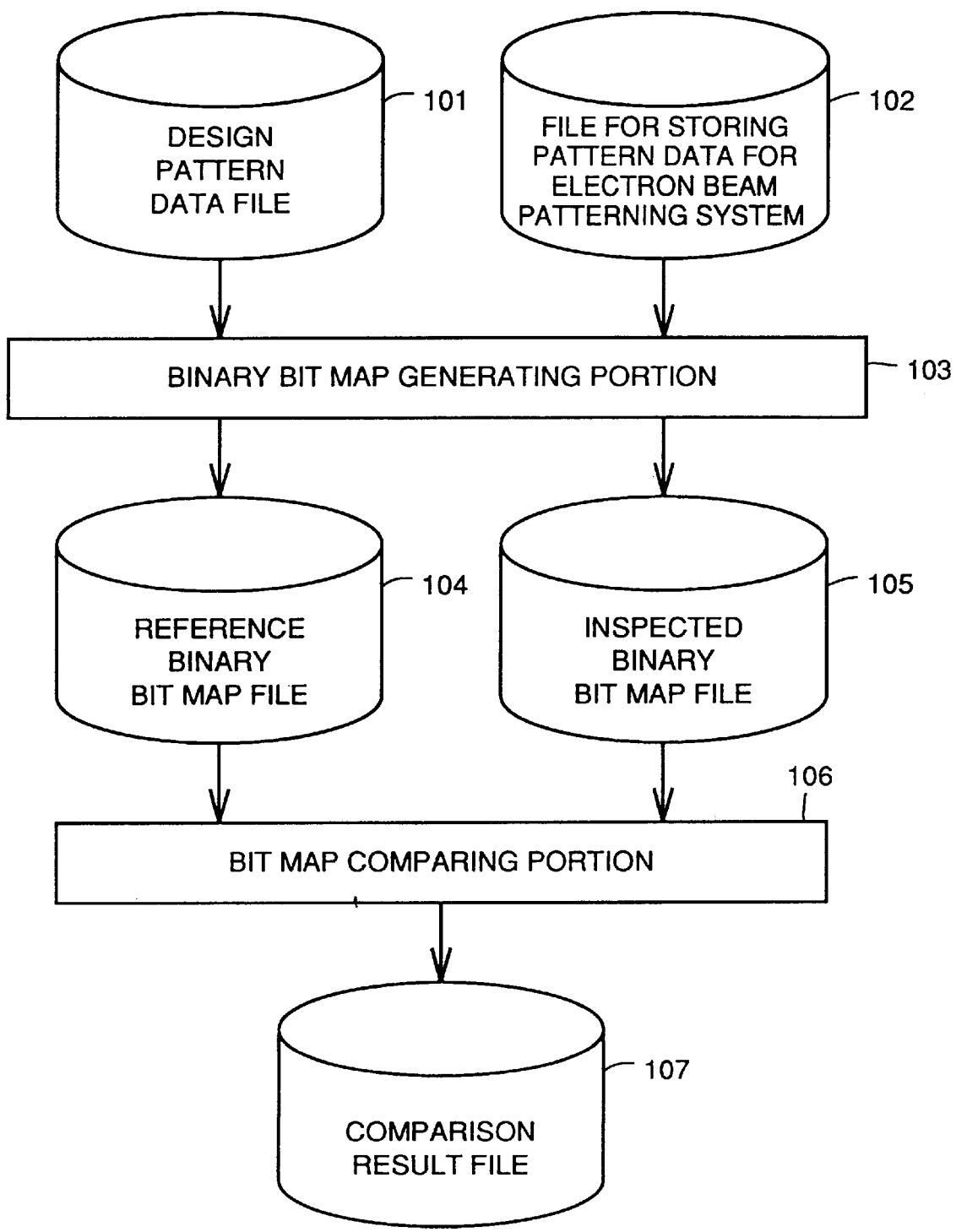
FIG. 1 is a block diagram showing a configuration of a conventional pattern comparison device.
Figure 2:
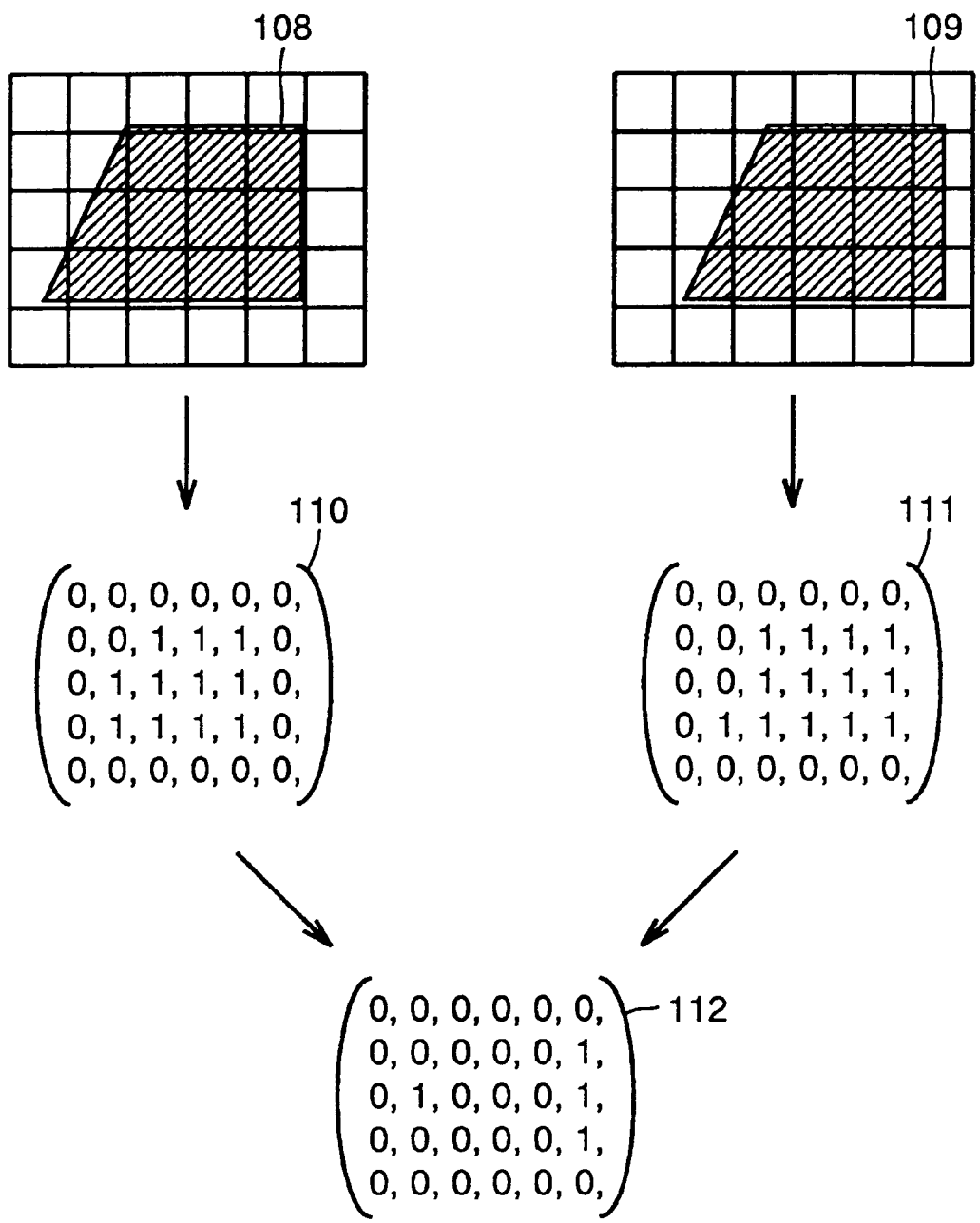
FIG. 2 shows a reference binary bit map generated from design pattern data, an inspected binary bit map generated from pattern data for an electron beam patterning system, and a result of a comparison of the bit maps.
Figure 3:
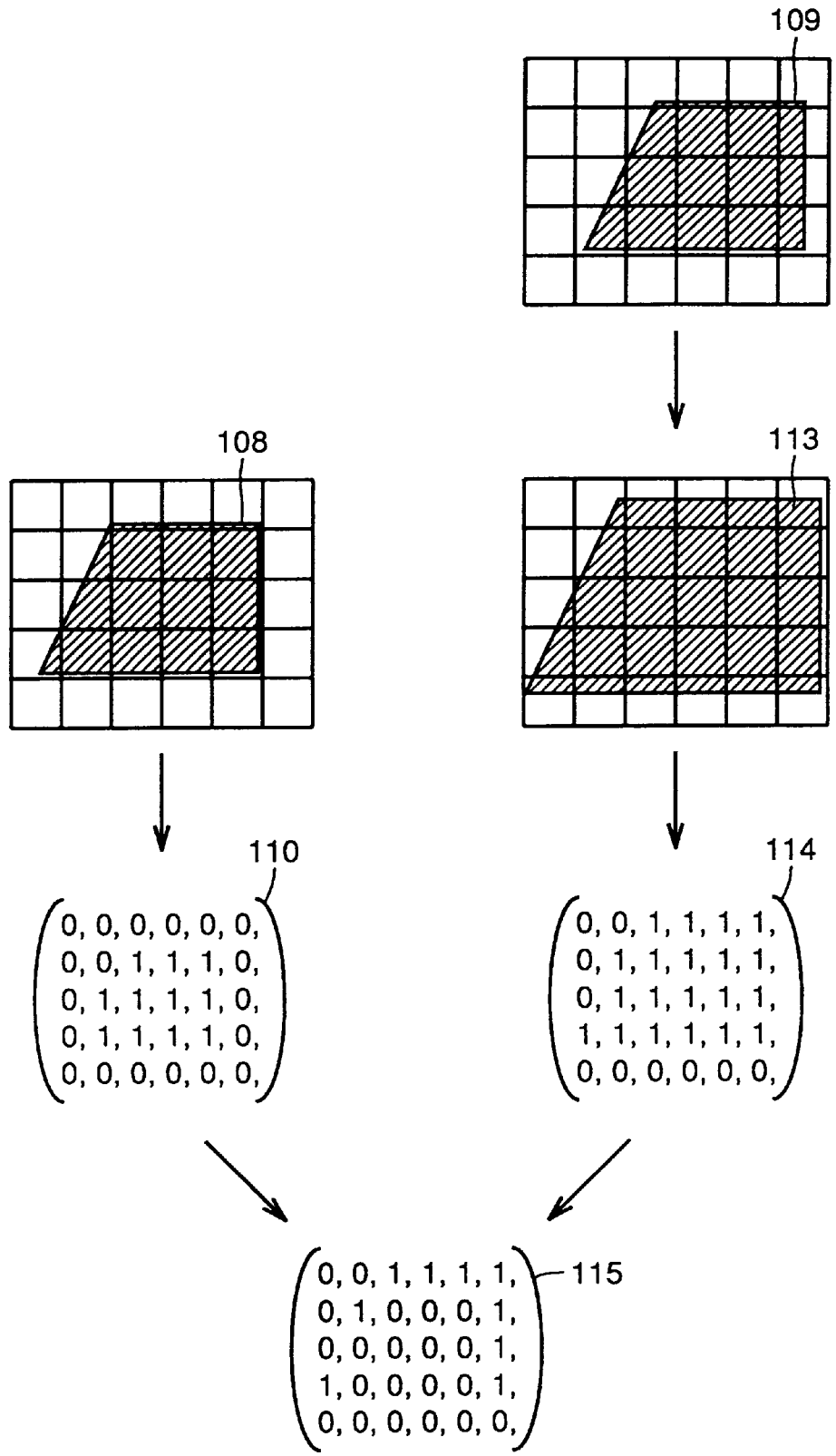
FIG. 3 shows a reference binary bit map generated from design pattern data, an inspected binary bit map when a sizing processing is applied to pattern data for an electron beam patterning system, and a result of a comparison of the bit maps.
Figure 4:
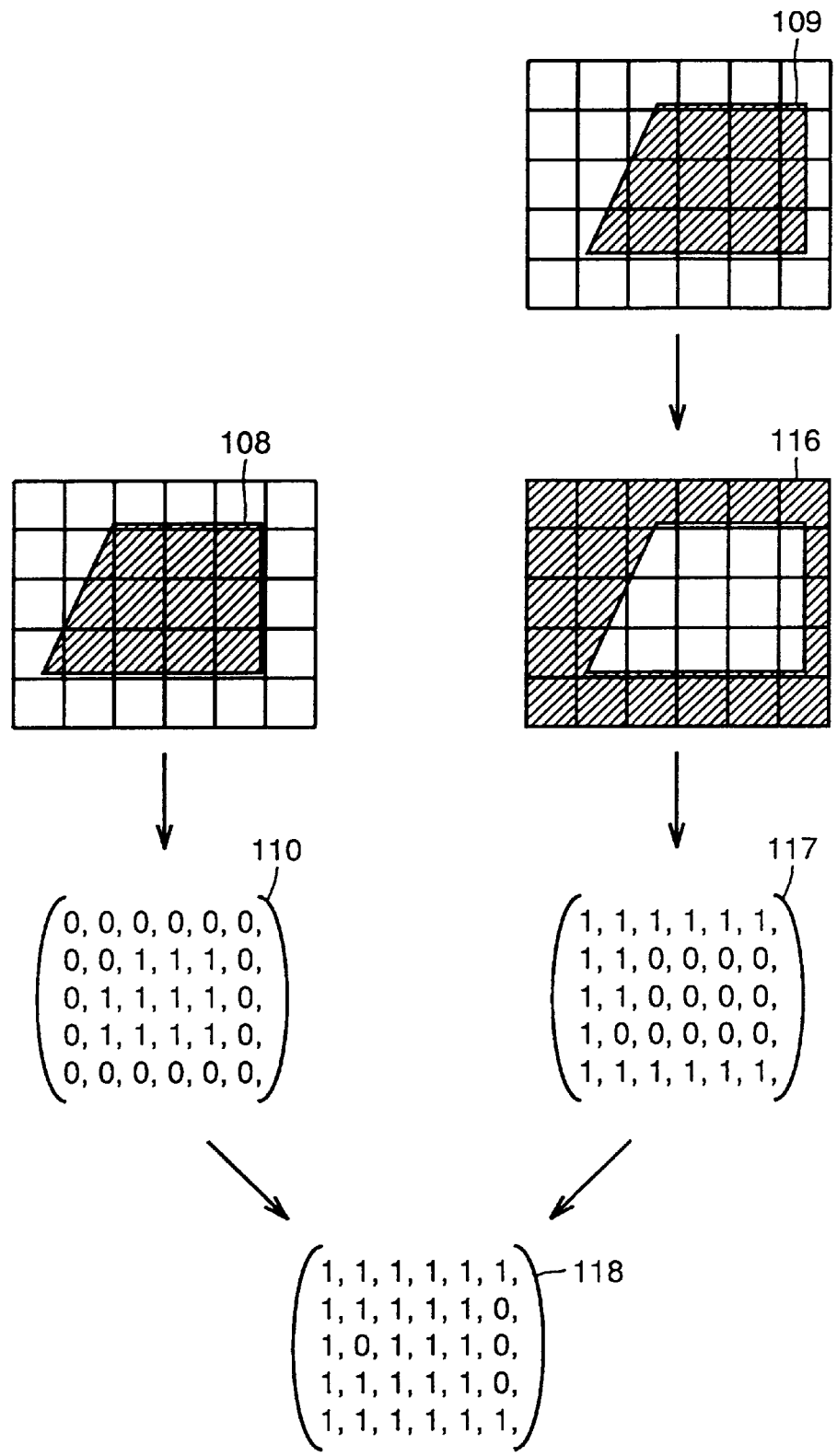
FIG. 4 shows a reference binary bit map generated from design pattern data, an inspected binary bit map when black-white inversion is applied to pattern data for an electron beam patterning system, and a result of a comparison of the bit maps.
Figure 29:
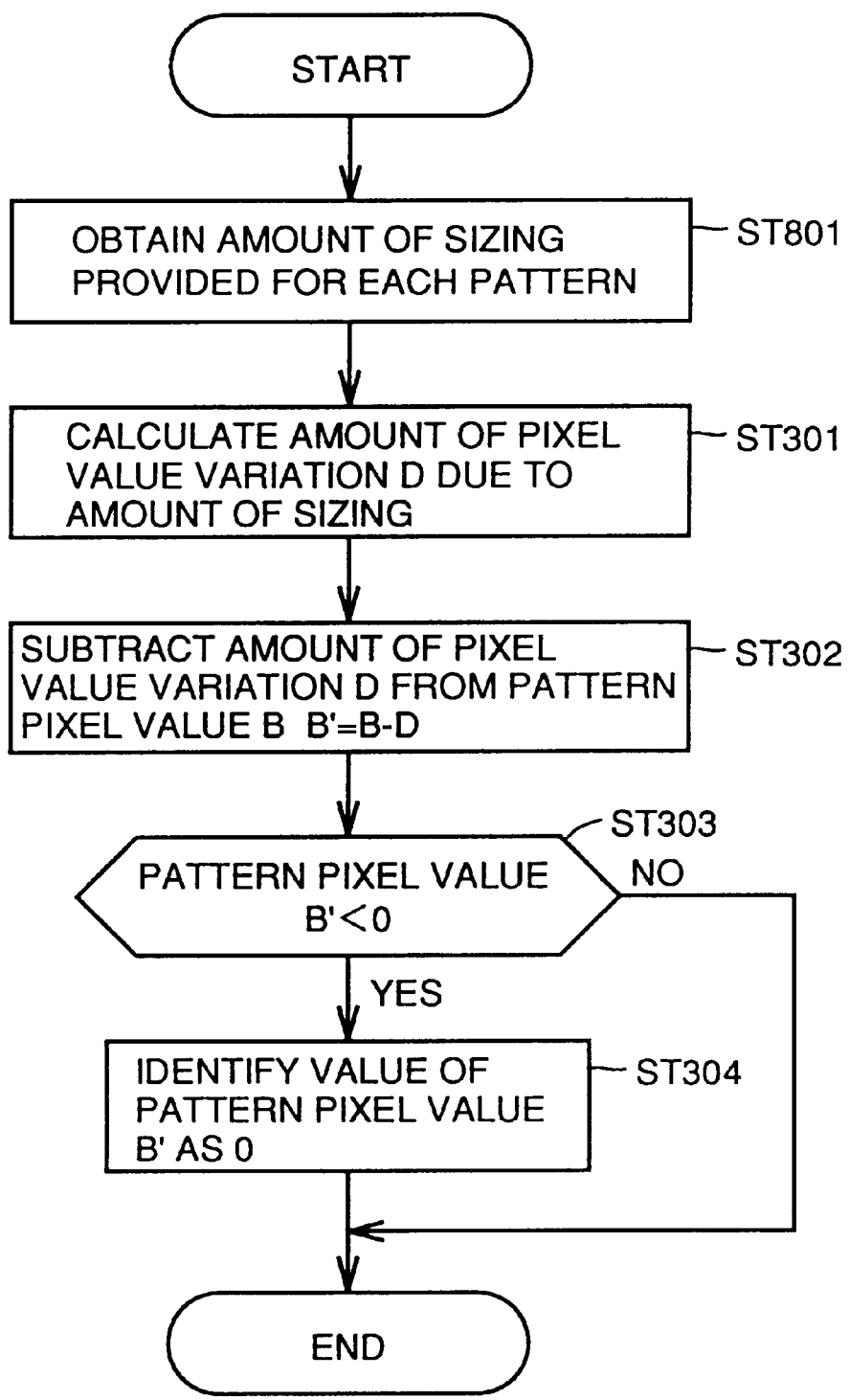
FIG. 29 is a flow chart illustrating a processing procedure of a pattern comparison inspection system according to an eighth embodiment of the present invention.

A processing procedure of the pattern comparison inspection system according to the eighth embodiment is illustrated by the flow chart illustrating the processing procedure of the pattern comparison inspection system according to the first embodiment shown in FIG. 4 wherein steps ST801 and ST301–ST304 in the flow chart shown in FIG. 29 are inserted between ST106 and ST107. Steps ST301–304 shown in FIG. 29 are the same as steps ST301–ST304 in the flow chart shown in FIG. 14 illustrating the processing procedure of the pattern comparison inspection system according to the third embodiment, and thus detailed descriptions thereof are not repeated. First, the amount of sizing of a pattern to be inspected is obtained (ST801). The amount of sizing is provided as a processing history in producing EB pattern data from design pattern data for each pattern to which sizing is applied. Then, the amount of sizing for the pattern obtained is used to perform the processing from step ST301 onward.

According to the present embodiment, an amount of sizing can be adjusted for each pattern, as described above, in comparing and inspecting EB pattern data after a sizing processing for improving finished precision of a mask for state-of-the-art devices has been applied. Thus, only a true non-match portion can be detected and thus designer's work efficiency in finding non-match portions can be improved.

Ninth Embodiment

Figure 30:
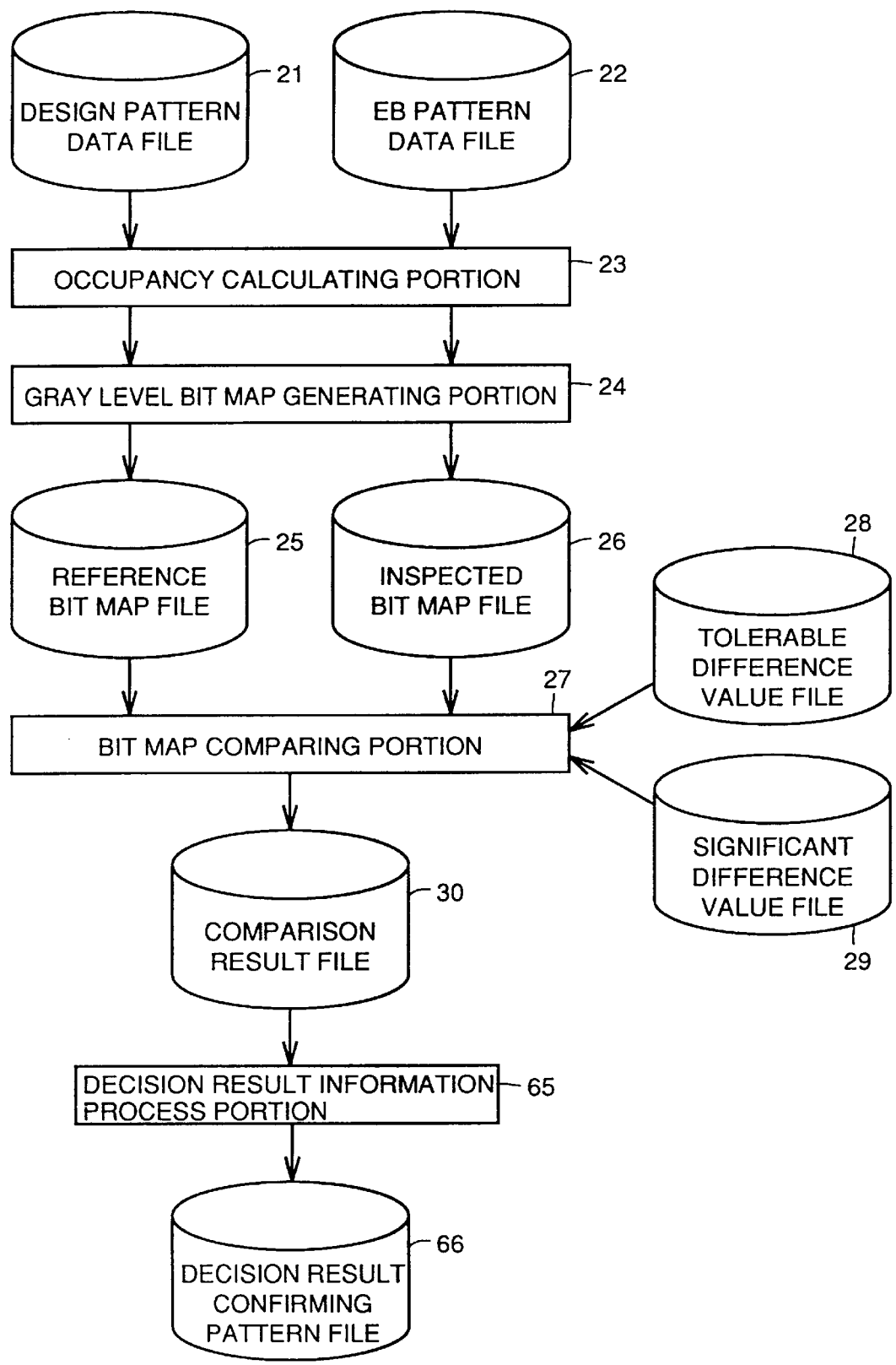
FIG. 30 is a block diagram showing a configuration of a pattern comparison inspection system according to a ninth embodiment of the present invention.

Referring to FIG. 30, the pattern comparison inspection system differs from that according to the first embodiment shown in FIG. 7 only in that it further includes a decision result information process portion 65 and a decision result confirming pattern file 66. The portion other than decision result information process portion 65 and decision result confirming pattern file 66 is the same in function as that of the pattern comparison inspection system according to the first embodiment shown in FIG. 7, and thus a detailed description thereof is not repeated. Decision result information process portion 65 reads a comparison result from comparison result file 30 and extracts any non-match portion or warned portion of a pattern to generate a confirming pattern for visually confirming the location of the non-match or warned portion in the pattern. The confirming pattern is stored into decision result confirming pattern file 66 and also displayed on graphic display device 2.

Figure 31:
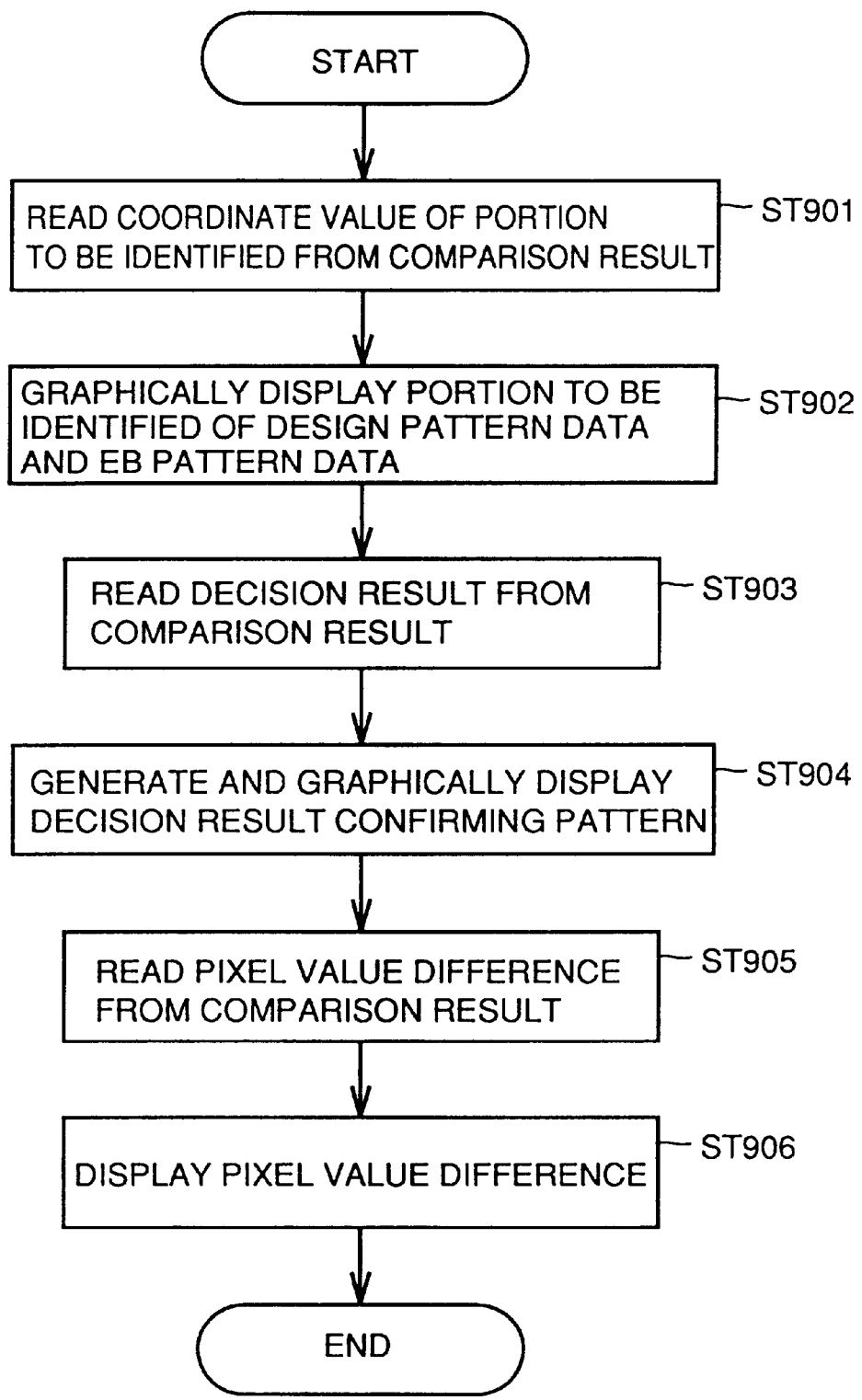
FIG. 31 is a flow chart illustrating a processing procedure of a pattern comparison inspection system according to the ninth embodiment.

A processing procedure of the pattern comparison inspection system according to the ninth embodiment is illustrated by the flow chart illustrating the processing procedure of the pattern comparison inspection system according to the first embodiment shown in FIG. 8 wherein step ST113 is followed by steps ST901–ST906 in the flow chart shown in FIG. 31, and thus detailed descriptions of the overlapping steps are not repeated.

Decision result information process portion 65 reads a coordinate value of a portion to be identified of a pattern from a comparison result stored in comparison result file 30 (ST901). Then, the portion to be identified in design pattern data and EB pattern data is displayed on graphic display device 2 (ST902).

Then, decision result information process portion 6S reads a decision result of the portion to be identified from the comparison result (ST903) and then generates a confirming pattern based on the decision result. The confirming pattern is generated as a pattern, for example, hatching a different portion between the design pattern data and the EB pattern data in a non-match or warned portion. Then, the confirming pattern is displayed to overlap the design pattern data and EB pattern data displayed at step ST902 and is also stored into decision result confirming pattern file 66 (ST904).

Decision result information process portion 65 also reads the pixel value difference of the portion to be identified from the comparison result (ST905) and displays the pixel value difference such that it corresponds to the confirming pattern displayed at step ST904 (ST906).

As described above, according to the present embodiment, a confirming pattern can be generated at a portion identified as non-match or warned, and design pattern data, EB pattern data, a confirming pattern for a portion to be identified and a pixel value difference can be automatically displayed, to improve designer's work efficiency in finding non-match portions.

Tenth Embodiment

A pattern comparison inspection system according to a tenth embodiment of the present invention is the same in configuration as the pattern comparison inspection system according to the third embodiment shown in FIG. 13. However, an amount-of-sizing adjusting portion thereof is the same in function as the amount-of-sizing adjusting portion according to the sixth embodiment and thus it is designated by reference numeral 38'. Furthermore, a gray level bit map generating portion thereof is different in function from the gray level bit map generating portion 24 according to the third embodiment and thus it is designated by a reference numeral 24'.

Figure 32:
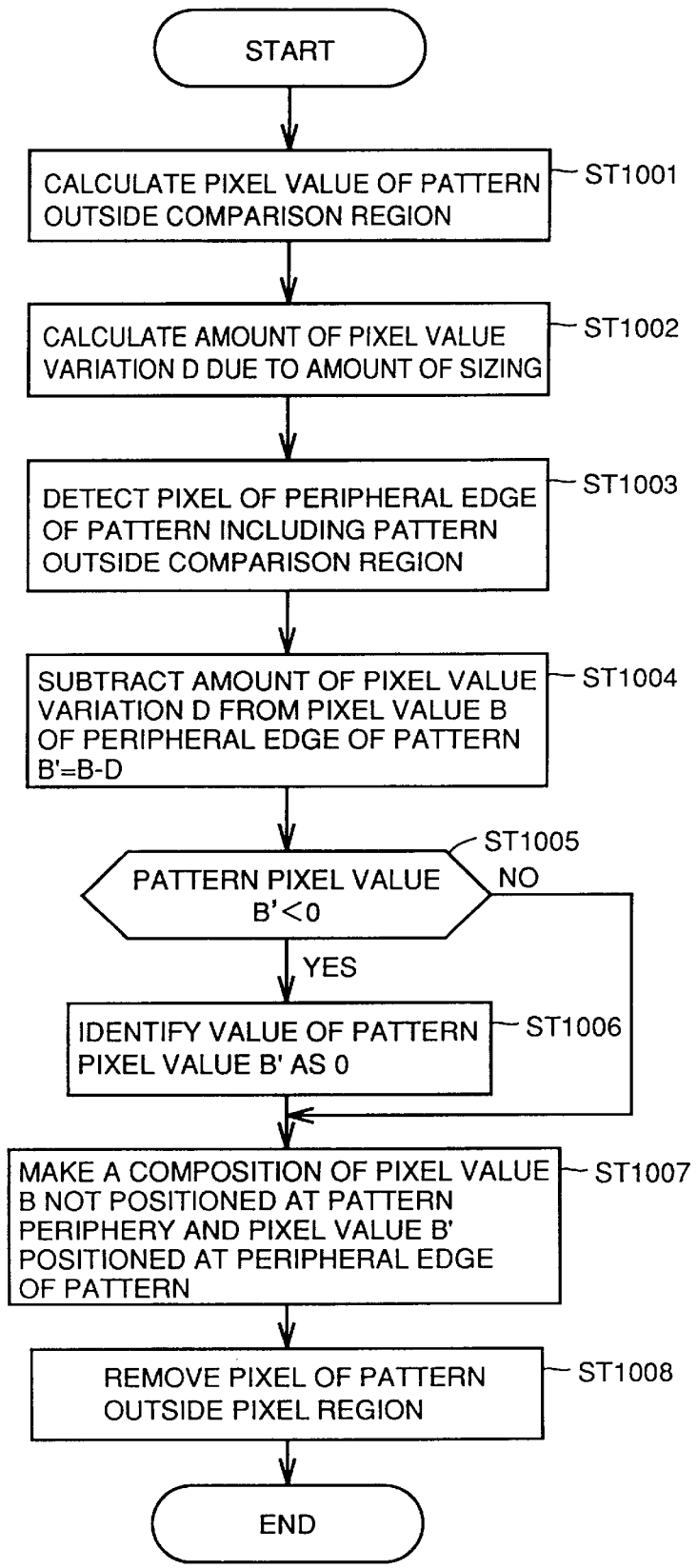
FIG. 32 is a flow chart illustrating a processing procedure of a pattern comparison inspection system according to a tenth embodiment of the present invention.

A processing procedure of the pattern comparison inspection system according to the tenth embodiment is illustrated by the flow chart illustrating the processing procedure of the pattern comparison inspection system according to the first embodiment shown in FIG. 8 wherein steps ST105 and ST106 are substituted with steps ST1001–ST1008 in the flow chart shown in FIG. 32, and thus detailed descriptions of the overlapping steps are not repeated. In the present embodiment, the designer sets a comparison region and performs pattern comparison and inspection within the comparison region.

Gray level bit map generating portion 24' calculates a pixel value of each pixel including EB pattern data adjacent to a comparison region at its outside. Then, an inspected bit map generated is stored into inspected bit map file 26 (ST1001).

Amount-of-sizing adjusting portion 38' calculates an amount of pixel value variation d by equation (1) (ST1002). Then, the inspected bit map containing pixels outside the comparison region is referred to, to detect any pixel of the peripheral edge of a pattern (ST1003). More specifically, among pixel values bs of an inspected bit map, a pixel adjacent at its upper, lower, right and left sides to pixels each having a value other than zero is not identified as a pixel of a peripheral edge, and a pixel is otherwise identified as a pixel of a peripheral edge as long as the pixel value of the pixel is not zero.

Then, the amount of pixel value variation d is subtracted from a pixel value b of the peripheral edge of the pattern to obtain a pixel value b' (ST1004). Then, if a pixel value b' is less than zero (ST1005, YES), the pixel value b' is identified as zero (ST1006). If a pixel value b' is equal to or more than zero (ST1005, NO), the pixel value b' is not changed. Then, a composition of a pixel value b outside the peripheral edge of the pattern and a pixel value b' of the peripheral edge of the pattern is made (ST1007). A pixel value of the pattern outside the comparison region within the composed bit map is removed (ST1008).

A bit map generated by the above processing is used as an inspected bit map to perform the processing from step ST107 onward.

Figure 33:
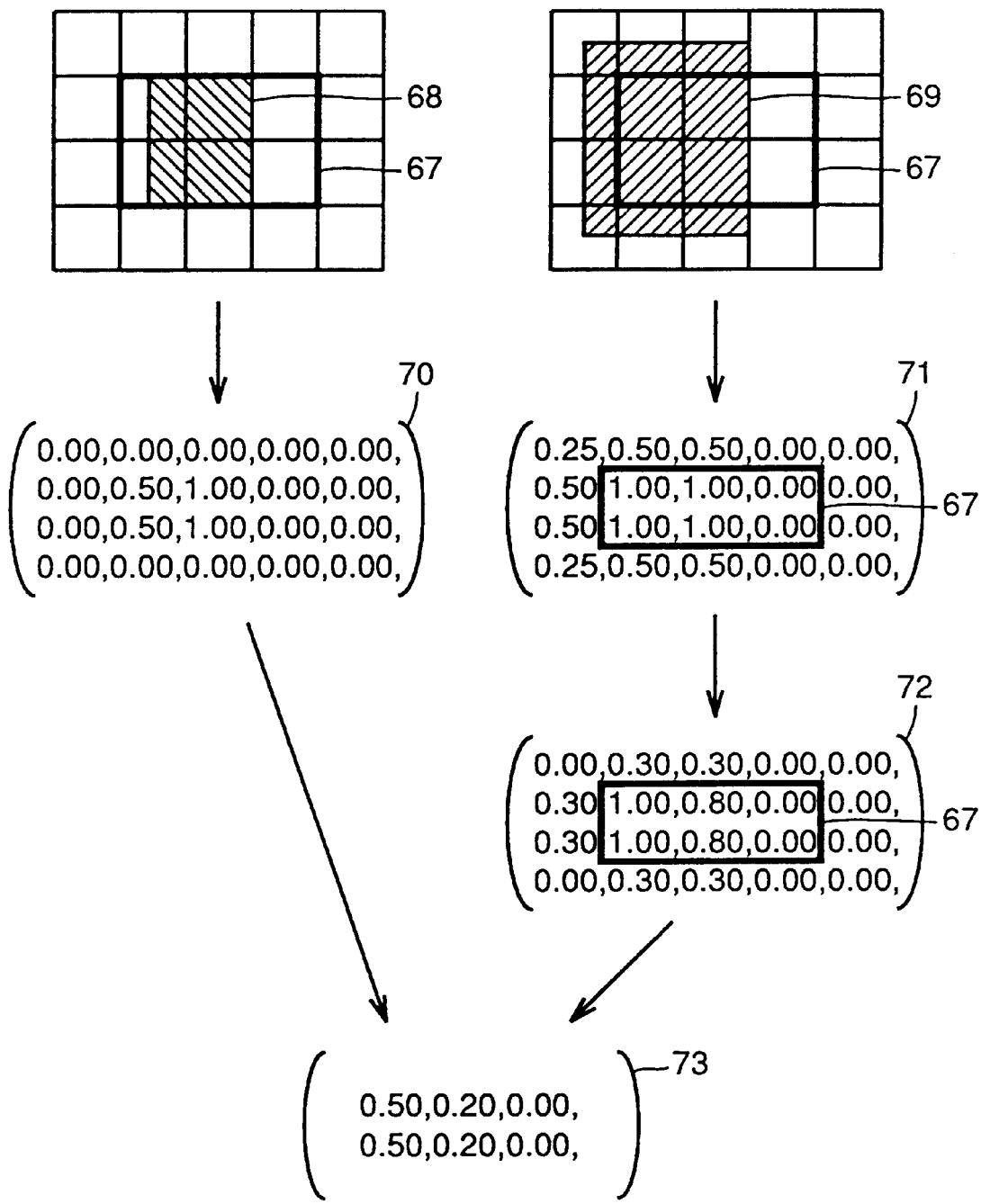
FIG. 33 is a diagram for illustrating adjustment of an amount of sizing when a comparison region is set.

Referring to FIG. 33, a bit map 71 is generated including an EB pattern 69 adjacent to a comparison region 67 at its outside. Bit map 71 has its amount of sizing adjusted to generate a bit map 72, and the pixel values within comparison region 67 of bit map 72 are compared with the pixel values within comparison region 67 of a bit map 70 generated from reference pattern data 68 to generate a bit map 73 formed of pixel value differences.

Thus, according to the present embodiment, in a pattern comparison within a comparison region, an amount of sizing can be adjusted including a pattern outside the comparison region, to adjust the amount of sizing of the pattern inside the comparison region. Thus, a difference can be automatically identified as a slight difference not substantially affecting mask quality or as a difference disadvantageously affecting mask quality, and the designer's work efficiency in confirming non-match portions can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pattern comparison inspection system comprising:
   occupancy calculating means for dividing pattern data into pixel regions and calculating a ratio of the divided pattern data to said pixel region;
   gray level bit map generating means for generating a gray level bit map based on the ratio of said divided pattern data; and
   bit map comparing means for making a comparison between a gray level bit map for design pattern data and a gray level bit map for pattern data for an electron beam patterning system both generated by said occupancy calculating means and said gray level bit map generating means to determine whether said pattern data for an electron beam patterning system matches said design pattern data.

2. The pattern comparison inspection system according to claim 1, wherein said bit map comparing means calculates an absolute value of a difference between a pixel value of a gray level bit map for said design pattern data and a pixel value of a gray level bit map for said pattern data for an electron beam patterning system to identify the pixel value of the gray level bit map for said pattern data for an electron beam patterning system as non-match when said absolute value of the pixel value difference exceeds a predetermined significant difference value, as warned when said absolute value of the pixel value difference does not exceed said significant difference value and exceeds a predetermined tolerable difference value, and as match when said absolute value of the pixel value difference does not exceed said tolerable difference value.

3. A pattern comparison inspection system comprising:
   occupancy calculating means for dividing pattern data into pixel regions and calculating a ratio of the divided pattern data to said pixel region;
   gray level bit map generating means for generating a gray level bit map based on the ratio of said divided pattern data; and
   multi-exposure detect means for detecting as multi-exposure a pixel region having a ratio of divided pattern data to the pixel region equal to or larger than a predetermined value within a gray level bit map for pattern data for an electron beam patterning system generated by said occupancy calculating means and said gray level bit map generating means.

4. The pattern comparison inspection system according to claim 1, further comprising amount-of-sizing adjusting means for adjusting a pattern difference due to uniform sizing in a gray level bit map, wherein
   said bit map comparing means makes a comparison between a gray level bit map for said design pattern data and a gray level bit map for said pattern data for an electron beam patterning system adjusted by said amount-of-sizing adjusting means to determine whether said pattern data for an electron beam patterning system matches said design pattern data.

5. The pattern comparison inspection system according to claim 1, further comprising black-white inversion means for black-white inverting a gray level bit map, wherein
   said bit map comparing means makes a comparison between a gray level bit map for said design pattern data and a gray level bit map for said pattern data for an electron beam patterning system black-white inverted by said black-white inversion means to determine whether said pattern data for an electron beam patterning system matches said design pattern data.

6. The pattern comparison inspection system according to claim 1, further comprising comparison and decision value calculating means for calculating a tolerable difference value and a significant difference value from a grid size, amount of sizing and pixel size of said pattern data for an electron beam patterning system, wherein
   said bit map comparing means calculates an absolute value of a difference between a pixel value of a gray level bit map for said design pattern data and a pixel value of a gray level bit map for said pattern data for an electron beam patterning system to identify the pixel value of the gray level bit map for said pattern data for an electron beam patterning system as non-match when said absolute value of the pixel value difference exceeds said significant difference value, as warned when said absolute value of the pixel value difference does not exceed said significant difference value and exceeds said tolerable difference value, and as match when said absolute value of the pixel value difference does not exceed said tolerable difference value.

7. The pattern comparison inspection system according to claim 4, wherein said amount-of-sizing adjusting means detects a peripheral edge of a pattern in a gray level bit map and adjusts a pattern difference of only a pixel of the peripheral edge.

8. The pattern comparison inspection system according to claim 1, wherein said bit map comparing means identifies a pixel to be compared with as match or non-match by comparing said pixel to be compared with and eight pixels adjacent to said pixel to be compared with within a gray level bit map for said pattern data for an electron beam patterning system with said pixel to be compared with and pixels to adjacent to said pixel to be compared with within a gray level bit map for said design pattern data.

9. The pattern comparison inspection system according to claim 1, further comprising amount-of-sizing adjusting means for adjusting a pattern difference based on an amount of sizing provided to a gray level bit map for each pattern, wherein said bit map comparing means makes a comparison between a gray level bit map for said design pattern data and a gray level bit map for said pattern data for an electron beam patterning system adjusted by said amount-of-sizing adjusting means to determine whether said pattern data for an electron beam patterning system matches said design pattern data.

10. The pattern comparison inspection system according to claim 1, further comprising decision result information process means for generating a confirming pattern for distinguishing a pixel identified as non-match from a pixel identified as match.

11. The pattern comparison inspection system according to claim 1, wherein said bit map comparing means detects a peripheral edge of a pattern of pattern data for an electron beam patterning system including a pattern adjacent to a predetermined comparison region at an outside thereof, generates a gray level bit map having pattern sizing adjusted for only a pixel of the peripheral edge and makes a comparison between said gray level bit map for said design pattern data and said adjusted bit map only within said comparison region to determine whether said pattern data for an electron beam patterning system matches said design pattern data.

12. A method of comparing and inspecting a pattern, comprising the steps of:
   dividing design pattern data into pixel regions and calculating a ratio of the divided design pattern data to said pixel region;
   generating a gray level bit map based on the ratio of said divided design pattern data;
   dividing pattern data for an electron beam patterning system into said pixel regions and calculating a ratio of said divided pattern data for an electron beam patterning system to said pixel region;
   generating a gray level bit map based on the ratio of said divided pattern data for an electron beam patterning system; and
   making a comparison between a gray level bit map for said design pattern data and a gray level bit map for said pattern data for an electron beam patterning system to determine whether said pattern data for an electron beam patterning system matches said design pattern data.

13. A method of comparing and inspecting a pattern, comprising the steps of:
   dividing pattern data for an electron beam patterning system into pixel regions and calculating a ratio of said divided pattern data for an electron beam patterning system to said pixel region;
   generating a gray level bit map based on the ratio of said divided pattern data for an electron beam patterning system; and
   detecting as multi-exposure a pixel region having a ratio of divided pattern data for an electron beam patterning system equal to or more than a predetermined value in a gray level bit map for said pattern data for an electron beam patterning system.

14. A medium having a pattern comparison inspection program recorded thereon, comprising the steps of:
   dividing design pattern data into pixel regions and calculating a ratio of the divided design pattern data to said pixel region;
   generating a gray level bit map based on the ratio of said divided design pattern data;
   dividing pattern data for an electron beam patterning system into said pixel regions and calculating a ratio of the divided pattern data for an electron beam patterning system to said pixel region;
   generating a gray level bit map based on the ratio of said divided pattern data for an electron beam patterning system; and
   making a comparison between a gray level bit map for said design pattern data and a gray level bit map for said pattern data for an electron beam patterning system to determine whether said pattern data for an electron beam patterning system matches said design pattern data.

15. A medium having a pattern comparison inspection program recorded thereon, comprising the steps of:
   dividing pattern data for an electron beam patterning system into pixel regions and calculating a ratio of the divided pattern data for an electron beam patterning system to said pixel region;
   generating a gray level bit map based on the ratio of said divided pattern data for an electron beam patterning system; and
   detecting as multi-exposure a pixel region having a ratio of divided pattern data for an electron beam patterning system to the pixel region equal to or more than a predetermined value in a gray level bit map for said pattern data for an electron beam patterning system.

16. A pattern comparison inspection system comprising:
   an occupancy calculating portion that divides pattern data into pixel regions and calculates a ratio of the divided pattern data to said pixel region;
   a gray level bit map generating portion that generates a gray level bit map based on the ratio of said divided pattern data; and
   a bit map comparing portion that makes a comparison between a gray level bit map for design pattern data and a gray level bit map for pattern data for an electron beam patterning system both generated by said occupancy calculating portion and said gray level bit map generating portion to determine whether said pattern data for an electron beam patterning system matches said design pattern data.

17. A pattern comparison inspection system comprising:
   an occupancy calculating portion that divides pattern data into pixel regions and calculates a ratio of the divided pattern data to said pixel region;
   a gray level bit map generating portion that generates a gray level bit map based on the ratio of said divided pattern data; and
   a multi-exposure detecting portion that detects a multi-exposure pixel region having a ratio of divided pattern data to the pixel region equal to or larger than a predetermined value within a gray level bit map for pattern data for an electron beam patterning system generated by said occupancy calculating portion and said gray level bit map generating portion.

* * * * *